Figure 1:
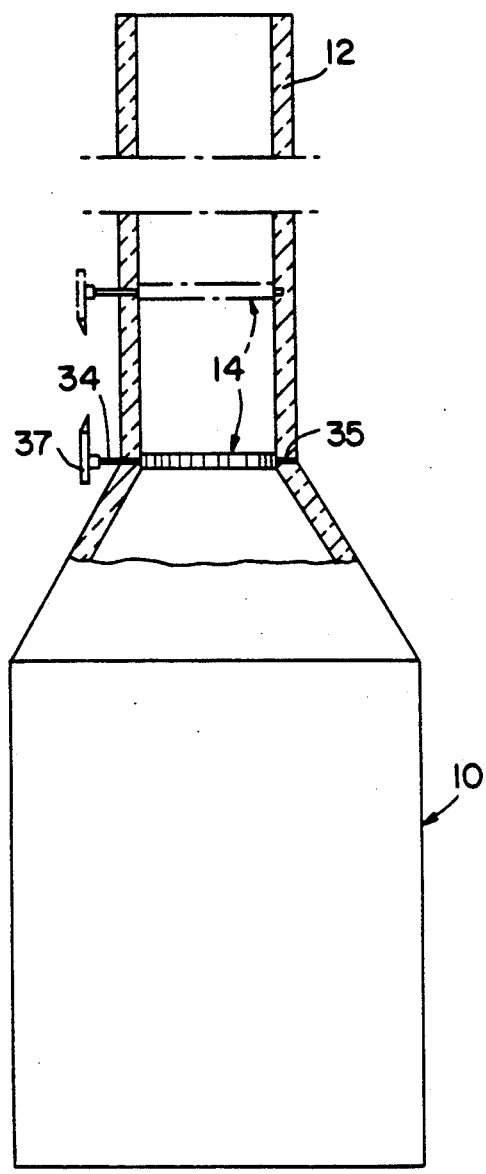

United States Patent [19]
Baldi

[11] Patent Number: 5,182,078
[45] Date of Patent: * Jan. 26, 1993

[54] METAL TREATMENT

[75] Inventor: Alfonso L. Baldi, Sea Isle City, N.J.

[73] Assignee: Alloy Surfaces Company, Inc., Wilmington, Del.

[*] Notice: The portion of the term of this patent subsequent to Sep. 18, 2007 has been disclaimed.

[21] Appl. No.: 533,879

[22] Filed: Jun. 6, 1990

Related U.S. Application Data

[63] Continuation-in-part of Ser. No. 472,663, Jan. 30, 1990, Pat. No. 5,077,257, which is a continuation-in-part of Ser. No. 289,595, Dec. 22, 1988, Pat. No. 4,965,095, which is a continuation-in-part of Ser. No. 182,718, Apr. 18, 1988, Pat. No. 4,970,114, which is a continuation-in-part of Ser. No. 28,741, Mar. 23, 1987, Pat. No. 4,927,798, each is a continuation-in-part of Ser. No. 205,387, Jun. 10, 1988, Pat. No. 4,895,609, which is a continuation-in-part of Ser. No. 96,368, Sep. 11, 1987, Pat. No. 4,880,483, which is a continuation-in-part of Ser. No. 862,712, May 13, 1986, Pat. No. 4,871,708, which is a continuation-in-part of Ser. No. 707,656, Mar. 4, 1985, Pat. No. 4,824,482, which is a continuation-in-part of Ser. No. 685,910, Dec. 27, 1984, Pat. No. 4,820,362, which is a continuation-in-part of Ser. No. 584,538, Feb. 28, 1984, Pat. No. 4,845,139, which is a continuation-in-part of Ser. No. 538,541, Oct. 3, 1983, Pat. No. 4,830,931, which is a continuation-in-part of Ser. No. 632,016, Jul. 18, 1984, abandoned, which is a continuation-in-part of Ser. No. 571,510, Jan. 17, 1984, Pat. No. 4,537,927, which is a continuation-in-part of Ser. No. 554,441, Nov. 22, 1983, abandoned, which is a continuation-in-part of Ser. No. 488,103, Apr. 25, 1983, Pat. No. 4,615,920, which is a continuation-in-part of Ser. No. 417,214, Sep. 13, 1982, abandoned, which is a continuation-in-part of Ser. No. 281,405, Jul. 8, 1981, Pat. No. 4,708,913, which is a continuation-in-part of Ser. No. 172,671, Jul. 28, 1980, Pat. No. 4,435,481.

[51] Int. Cl.⁵ .................................. B22F 7/06
[52] U.S. Cl. .................................. 419/9; 419/26
[58] Field of Search ......................... 419/9, 26

[56] References Cited

U.S. PATENT DOCUMENTS 4,957,421 9/1990 Baldi .................................. 419/8

Primary Examiner—Donald P. Walsh
Assistant Examiner—Daniel J. Jenkins
Attorney, Agent, or Firm—Connolly and Hutz

[57] ABSTRACT

Diffusion coating can be speeded by high heat input. Diffusion coating packs can be made with chemically reduced metal content of sludges. Diffusion aluminizing followed by caustic leaching to remove much of the diffused-in aluminum, yields catalytically and pyrophorically active porous surface that also accepts top coatings. Mixtures of aluminum powder with nickel and/or iron powders react when heated to form Raney-like product that can be leached to become pyrophoric, and when held on a metal foil or gauze web will adhere to the web so that leached product can be used as pyrophoric foil for decoying heat-seeking missiles. Such adhesion is improved by addition of small amount of copper.

11 Claims, 2 Drawing Sheets

METAL TREATMENT

This application is in part a continuation of applications:
Ser. No. 472,663 filed Jan. 30, 1990, now U.S. Pat. No. 5,077,257;
Ser. No. 289,595 filed Dec. 22, 1988, now U.S. Pat. No. 4,965,095;
Ser. No. 182,718 filed Apr. 18, 1988, now U.S. Pat. No. 4,970,114;
Ser. No. 028,741 filed Mar. 23, 1987, now U.S. Pat. No. 4,927,798.

The foregoing are in turn direct or chained continuations-in-part of Applications:
Ser. No. 205,387 filed Jun. 10, 1988 (U.S. Pat. No. 4,895,609),
Ser. No. 096,368 filed Sep. 11, 1987 (U.S. Pat. No. 4,880,483),
Ser. No. 862,712 filed May 13, 1986 (U.S. Pat. No. 4,871,708),
Ser. No. 707,656 filed Mar. 4, 1985 (U.S. Pat. No. 4,824,482),
Ser. No. 685,910 filed Dec. 27, 1984 (U.S. Pat. No. 4,820,362),
Ser. No. 584,538 filed Feb. 28, 1984 (U.S. Pat. No. 4,845,139),
Ser. No. 538,541 filed Oct. 3, 1983 (U.S. Pat. No. 4,830,931),
Ser. No. 632,016 filed Jul. 18, 1984 and subsequently abandoned.
Ser. No. 571,510 filed Jan. 17, 1984 (U.S. Pat. No. 4,537,927),
Ser. No. 554,441 filed Nov. 22, 1983 and subsequently abandoned,
Ser. No. 488,103 filed Apr. 25, 1983 (U.S. Pat. No. 4,615,920)
Ser. No. 417,214 filed Sep. 13, 1982 and subsequently abandoned,
Ser. No. 281,405 filed Jul. 8, 1981 (U.S. Pat. No. 4,708,913), and
Ser. No. 172,671 filed Jul. 28, 1980 (U.S. Pat. No. 4,435,481).

The present invention relates to diffusion-coated metals and to techniques for making and using them.

Among the objects of the present invention is the provision of improved techniques and products of the foregoing types.

Figure 2:
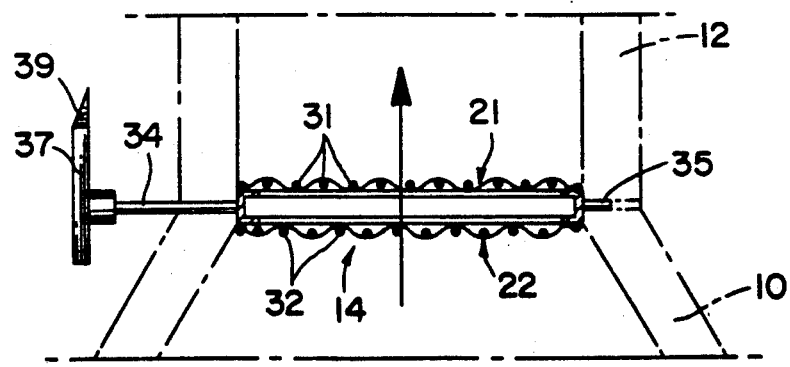
Figure 3:
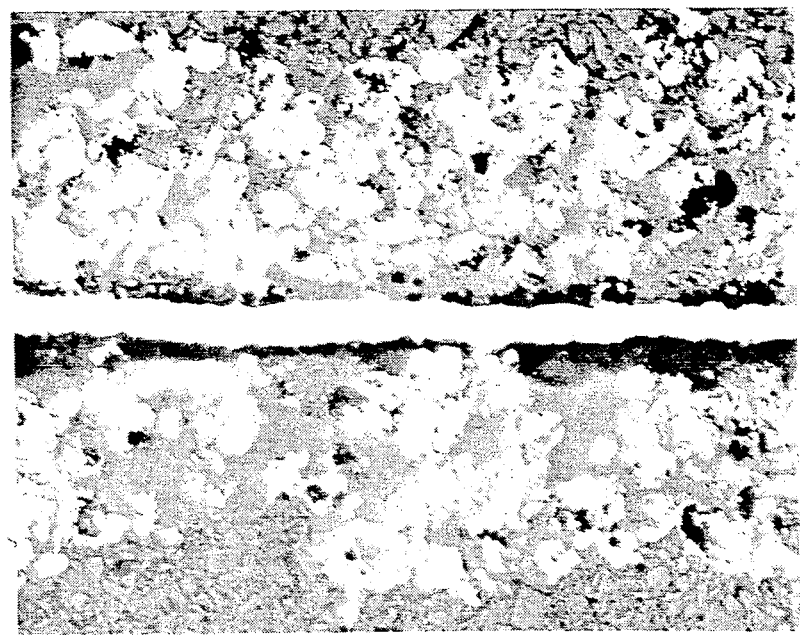
Figure 4:
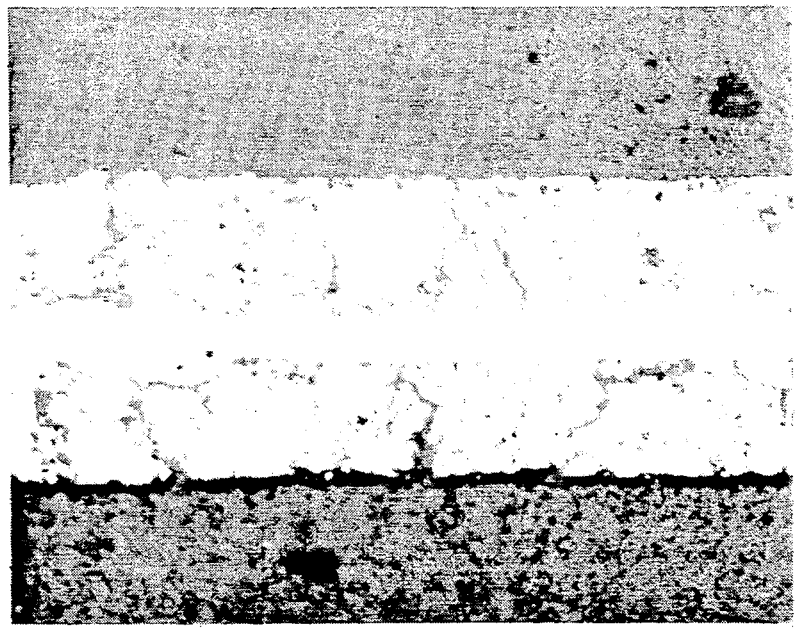

The foregoing as well as additional objects of the present invention will be more fully understood from the following descriptions of several of its exemplifications, reference being made to the accompanying drawings in which:

FIG. 1 illustrates one use of an activated metal pursuant to the present invention, FIG. 2 is an enlarged sectional detail of the combination of FIG. 1, FIG. 3 in an enlarged photomicrograph of a section through a different activated metal arrangement of the present invention, and FIG. 4 is a similar view of the arrangement of FIG. 3 after it has been subjected to a compacting treatment.

Aluminizing of titanium or any other substrate can be effected in very short times by specially heating a workpiece embedded in an activated powder pack, with a thermal input that brings it to diffusion coating temperature and completes the diffusion coating all in about 50 minutes or less. During this short interval the activator present in the pack begins to be volatilized at a relatively rapid rate that persists about 45 minutes, even if only present in the pack at a concentration of 0.5% by weight, and the formation of the diffusion coating case is extremely rapid. Thus, a 2 mil aluminized case is produced only about 30 minutes after starting to heat an iron or steel workpiece to 980° C. in a pack of:

10 parts by weight: Aluminum powder about 100 microns in size
45 parts by weight: Chromium powder about 10 microns in size
50 parts by weight: $Al_2O_3$ about 100 microns in size with 0.5% $NH_4Cl$ mixed in and based on the weight of the pack, if the workpiece reaches temperature in 15 minutes. The resulting aluminized case can have non-uniform thicknesses.

It is preferred to have the workpiece covered by no more than about ⅛ inch of activated pack when it is heated, inasmuch as the pack acts as thermal insulation and slows down the penetration of the heat to the workpiece from the walls of the retort in which it is held during the heating. With the workpiece embedded in a pack held in a cylindrical retort having a 7-inch length and a 2-inch diameter, so that about ½-inch pack thickness envelopes the workpiece, heat supplied at the rate of at least about 200,000 BTU per hour per pound of workpiece will effect the desired heat-up to temperatures as high as 1000° C. During such heat-up the retort can have one or both its ends loosely covered to permit escape of gases, and can be held in a larger retort through which hydrogen or argon is flowed at a slow rate to flush out the escaping gases.

It is not necessary to arrange the workpiece so that it comes to within ¼ inch of the retort as described in U.S. Pat. No. 3,824,122. Indeed, the presence of a ½-inch thick pack covering is preferred when practicing the rapid diffusion coating of the present invention inasmuch as it assures the presence of sufficient energizer even when the energizer content of the pack is only 0.5% or less by weight. The energizer content can be increased, for example, to 1% or 2%, and where the workpiece contains a narrow passageway the wall of which is to be diffusion coated as in U.S. Pat. No. 4,347,267, the passageway can be filled or have its wall coated with a diluent-free mixture of activator and the metal to be coated on the wall.

A retort packed in accordance with the rapid diffusion coating technique of the present invention can contain a number of workpieces. There is no need to position each workpiece into its own carefully dimensioned closely fitting retort as in U.S. Pat. No. 3,824,122.

Diffusion coating at temperatures no higher than about 540° C., as in diffusion aluminizing to activate substrates, is even more readily accomplished in short periods of time——not over 45 minutes of heating is generally needed to bring the workpieces to temperature and obtain an aluminized case at least 1 mil thick. Thinner cases require only about 30 minutes or even less. Zinc and aluminum can both be very effectively and very rapidly diffusion coated onto other metals at the foregoing low temperatures.

To further save time the cooling of the diffusion coating retort is best effected by withdrawing it from the furnace in which the heating is carried out. Exposed to the ambient air and with the help of the flushing gas stream between the work-holding retort and an outer retort, the cylindrical retort assembly described above cools in about 15 minutes to the point that the outer retort can be opened and the inner retort withdrawn, exposed to the atmosphere and emptied. In this way the entire diffusion coating sequence including the completion of the cool-down takes only about an hour or 65 minutes. This compares with the 1½ hours disclosed in U.S. Pat. No. 3,824,122 for just the heating time. The cool-down can also be accelerated by blowing air over the cooling retort assembly or by lowering it into a quenching liquid such as water.

U.S. Pat. No. 3,117,846 suggests a powder pack diffusion heating for one-half hour, but that time does not include the time needed to bring the powder pack and the workpiece to the diffusion coating temperature. Such heat-up time is generally a number of hours if the continuous treatment technique of U.S. Pat. No. 3,824,122 is not used.

Pack chromizing is generally not conducted at temperatures below about 600° C., so that it cannot be completed as rapidly as the most rapid pack aluminizings. However, a few hundred degrees increase in diffusion temperature only takes a few minutes longer to attain by the foregoing rapid heat-up technique.

The diffusion coating packs can be prepared by mixing together the individual pure ingredients, or from other sources such as scrap materials that contain one or more of the desired ingredients. Thus, chromium hydroxide sludges precipitated from used chromium plating or anodizing or leather tanning baths, are difficult to dispose of without creating environmental problems. A similar problem is faced by sludges from used nickel, cobalt and copper plating solutions, and from iron-loaded pickling rinses. Such sludges are, however, readily converted to pack diffusion ingredients as by drying and then reacting them with metallic magnesium, as described in U.S. Pat. No. 3,801,357, French Patent No. 1,123,326 and French Addition Patent No. 70,936. Such treatment converts chromium hydroxide to metallic chromium, while the magnesium is converted to magnesium oxide which acts as inert refractory diluent for the metallic chromium when the mixture is used as a diffusion chromizing pack.

The presence of aluminum hydroxide and other insoluble heavy metal compounds in the sludge need not interfere with the use of the magnesium-reacted product as a diffusion coating pack. A relatively large content of iron can, for example, be tolerated where the articles to be diffusion chromized have a substantial iron content. Most metals to be diffusion-coated are alloys containing many ingredients, and the presence of the corresponding ingredients in the diffusion coating packs in small amounts does not create problems. It is generally preferred that the contaminating metals be present in the sludge at a concentration less than 20% based on the total weight of the metal in the sludge. For this computation, only the metal portion of the compounds in the sludge are considered.

To minimize expense the content of metallic magnesium after the magnesium treatment is best kept quite low, as by using a stoichiometric or less than stoichiometric proportion of magnesium for that treatment, or by vacuum evaporating any residual magnesium metal to recover it. Insufficient magnesium will leave a little unreacted oxide of the sludge metal in the reduced mixture, but this metal oxide does no harm where the same metal is being diffusion coated. Indeed, a little dried but otherwise untreated sludge can be added to a use diffusion coating pack to make up for the metal that has diffused out. During the course of the next diffusion coating run with that replenished pack, some or all of the added metal hydroxide is converted to metal by the halide-containing hydrogen generally used as the diffusion coating atmosphere.

Excess magnesium in the sludge-reduction can also be tolerated. Some excess will evaporate off during the sludge-reducing heat but 1% to 2% residual magnesium in a chromizing pack is helpful and improves the chromized product.

The reducing action of the magnesium is effected by magnesium vapor, and the reducing step is generally conducted at a temperature of from about 760° C. to about 1100° C. in an inert or reducing atmosphere. The mixture resulting from the reducing reaction ordinarily has its components so tightly held to each other mechanically that they are difficult or impossible to separate by mechanical treatment. According to the present invention, however, no such separation is needed.

The following is an illustrative example:

EXAMPLE I

A chromium hydroxide sludge containing about 4% iron and 5% aluminum, based on the weight of its total metal content, has its pH adjusted to between 8 and 9 with ammonia or acetic acid, and is then dried at 1250° C. The resulting cake is ground and 900 grams of the ground product is poured over a 500-gram mass of magnesium in a steel pipe retort which is then loosely covered and placed in an outer retort having inlet and outlet lines for supplying it with a controlled atmosphere.

The retorts are then heated to 870° C. and kept within plus or minus 250° C. from that temperature for 10 hours, while a stream of argon is flushed through the outer retorts. At the end of time that period the retorts are cooled to room temperature, the argon flow then stopped, and the reacted product removed. It is a very fine mixture of magnesium oxide powder and reduced metal.

That mixture is then used as a pack chromizing powder to chromize a 1010 steel rod. About ½% by weight NH$_4$Cl is first added to and distributed through the mixture, and the resulting material used to pack the steel rod in a diffusion coating retort. The diffusion heat is conducted as described in U.S. Pat. No. 3,801,357 at 1900° F. for 12 hours. After cool-down, the chromized rod shows a high quality chromized surface. The small amount of aluminum originally in the sludge is apparently not effective to detract from the quality of the diffusion coating, and neither is its iron content.

Instead of using the magnesium-reduced sludge for a pack that causes its metal content to diffuse into a workpiece, it can be used as a masking mixture that prevents such diffusion coating. This is demonstrated in the following example:

EXAMPLE II

A concentrated sludge from the precipitation with soda ash of the nickel salts in a used nickel plating rinse bath is neutralized, dried and reacted with half its weight of magnesium as in Example I to produce a nickel-bearing powder. This powder is then slurried in a solution of ethyl methacrylate in methyl chloroform as described for the top masking layer in Example I of U.S. Pat. No. 4,208,453, and the slurry used in the aluminizing process of that Example. A very good masking is obtained.

Metallic aluminum is not as volatile as and does not behave like magnesium to effect the sludge reduction. Molten aluminum does reduce chromium oxide with which it comes into contact but the reduced metal tends to dissolve in or alloy with the molten aluminum and thus dilute the reducing action, eventually bringing it to a halt. A similar difficulty is also experienced with nickel oxide reduction, but not with iron oxide reduction.

Sludges of low-melting metals like aluminum, zinc and cadmium can be reduced with magnesium to also produce products useful for diffusion. Some oxides like zinc and aluminum oxides are more difficult for magnesium to reduce, and when present in chromium sludge, for example, will generally not be completely reduced, particularly if no excess of magnesium is used. This feature can be utilized to decrease the content of such difficulty reduced metals in a sludge containing more readily reduced materials that are of primary interest.

The foregoing very rapid diffusion coating technique is particularly suited for preparing pyrophoric articles such as the foils described in U.S. Pat. No. 4,292,208. A mass of such articles can be mixed up with the diffusion coating powder and very quickly aluminized as a batch. The aluminized articles can then be sifted away from the powder and leached to remove enough aluminum to make them pyrophoric.

Aluminizing and leaching sequences can be used to provide a porous metal surface that better receives coatings, regardless of pyrophoricity. Thus, a jet engine hot section turbine blade made of B-1900 superalloy can be heavily aluminized at about 600° C. to form an aluminized case 2 to 4 mils thick, after which the treated blade is subjected to boiling 30% NaOH in water for 12 hours to leach out most, if not all of the aluminum from the case. The blade surface is now very porous and can be kept under water to prevent pyrophoric reaction with air.

The porous-surfaced blade is now dipped into an aqueous 1% solution of platinum chloride and absorbs a substantial quantity of the platinum chloride in its pores. The resulting blade dried in an inert atmosphere or still wet is now inserted in a diffusion aluminizing retort and subject to chromaluminizing at about 980° C. for about 6 hours, as described in U.S. Pat. No. 3,801,357, or to corresponding simple aluminizing as described in U.S. Pat. No. 4,347,267. The final blade has a surface, the outer 2 to 4 mils of which contain platinum and aluminum in quantities that provide considerable resistance against high temperature attack by engine combustion products. Because the last diffusion coating is effected at a temperature which decomposes the platinum chloride into its elements, the platinum in the final blade is in metallic form and is quite uniformly distributed, probably as a platinum aluminide.

Other metals such as rhodium and other platinum family metals can be similarly impregnated relatively deeply into a workpiece. The coating of other nickel-base superalloys as well as of cobalt-base superalloys can be improved by the foregoing preliminary porosity-treatment sequence and diffusion coatings of chromium or other metals can be substituted for or added to the final aluminizing or chromaluminizing.

Metals like yttrium, hafnium and lanthanum that have protective oxides can be correspondingly impregnated in the form of a decomposable soluble salt like the sulfate or nitrate, and a workpiece thus impregnated heated to decompose the salt to oxide, and then diffusion aluminized or chromaluminized or chromized.

Very finely divided protective metals such as the MCrAlY, MCrAlHf and MCrAlZr alloys known in the art, but having particle sizes of about one micron or less can also be absorbed into the foregoing porous workpiece surfaces from dispersions in a liquid such as water, and then sintered in place by heat treatment that preferably effects at least a little diffusion into the surrounding metal. A final aluminizing or chromaluminizing or chromizing, which can be combined with the sintering step, acts to fill in the residual porosity remaining after the impregnating step.

The foregoing porosity is more effective than the porosity obtained by the partial surface depletion described in U.S. Pat. No. 4,041,196.

Aluminizing can be used with a subsequent leaching to prepare pyrophoric foils of the nickel or iron, as described above, and even to correspondingly prepare pyrophoric metal powder. Such pyrophoric powder can alternatively be prepared by leaching aluminum or zinc out of a crushed alloy of these metals with iron, nickel or the like. The resulting pyrophoricity can be used to trigger exothermic reactions to greatly increase the thermal output. Thus, pyrophoric iron powder made from iron-aluminum alloy also containing as little as 2% to 6% boron, generates much more heat and reaches temperatures as high as 1095° C. Such powders can be mixed with other readily ignited materials of high-heat output, as for example, powdered magnesium, lithium, boron, aluminum, titanium, carbon, silicon, uranium—preferably depleted from U-235 separation, molybdenum, tungsten, tantalum, vanadium, thorium, zirconium, beryllium and osmium. The mixed powders can be held together with a small amount of binder or can be compressed into discs or the like, and should contain sufficient pyrophoric metal to heat all of the mixture to ignition, and at least about 50% by weight is preferred.

The powder can be compressed with the help of metal honeycombs or screens as described in U.S. patent application Ser. No. 643,782 filed Jul. 17, 1984, U.S. Pat. No. 4,815,386.)

Such a pyrophoric powder or powder mixture can be used as a thermal decoy against heat-seeking missiles, as by projecting them into the air from a sealed container. They can, for example, be compressed or bonded into discs or rods and projected in that form. Such decoy materials can also be given radar chaff characteristics, as by inserting them into thin-walled aluminum or copper tubes about an inch long or longer—for example, 6 to 8 inches. A quantity of such powder having particles about 20 microns or less in size can be extruded with the help of a polyethylene or polystyrene binder into elongated rods about 7 to 15 mils thick, and the rods wrapped in a turn of aluminum foil ½ to 2 mils thick. The wrap can be held in place by the binder, using heat or solvent to cause it to adhere to the extruded rod or to a small overlap of the wrap. Cutting such a wrapped assembly into suitable lengths, preferably leaving the cut ends open so that air can get to the powder within the wrap, can complete the production, but care should be taken to conduct all of the steps while the powder is protected as by a film of water, from contact with oxygen.

Instead of or in addition to the open ends of the cut lengths, the wrap itself can be perforated to permit more ready access of air to the wrapped powder. On the other hand, such access can be hindered by increasing the proportion of binder to powder, and/or impregnating the powder particles with colloidal inert particles as described in Ser. No. 281,405 or with slowly volatilized liquids as described in Ser. No. 571,510.

Pyrophoric particles having different delay times, e.g., from one second to 30 seconds, can be mixed with each other and with the ignitible substrates, to extend the burning times.

Preformed tubes can also be used to hold the pyrophoric powder. Such tubes can be extruded and then have their wall thickness reduced as by chemical milling.

Regardless of how an activated leached iron or nickel surface is obtained, it can be used for many catalytic purposes including the oxidation of methane, and such use is improved by depositing on the surface a film of platinum or palladium, or a thin layer of fine zirconium oxide powder. Metal films are readily deposited by electroplating or in the case of platinum-family metals by decomposing the chloride or other salt of such metal. Powders can be applied by mixing them with colloidal alumina or silica in suspension in water, then applying the suspension and finally permitting the water to evaporate. The $ZrO_2$ changes the wave length of the radiation emitted when the activated surface pyrophorically reacts.

When diffusion aluminizing thin substrates such as iron foil only a few mils thick for the preparation of a pyrophoric product, the operation can be speeded up by applying the aluminum to the surface of the substrate and intensely heating the substrate to cause the applied aluminum to rapidly diffuse into its interior. When the aluminum is applied in liquid form, even greater speeds are attained. For these thin substrates the diffusion penetration need only be about one or two mils, and at a temperature of about 815° C. this can be effected in a few minutes.

Thus, a two-mil thick, one-inch wide type 1010 iron foil can be Schoop coated with about a 1½-mil thick layer of molten aluminum as the foil is unwound from a supply coil and passed into an argon box where it is induction heated to about 760° C. After five minutes of such heating, the foil is ready for the leaching step that renders it highly pyrophoric. The aluminum can alternatively be applied as a dispersion of powder in an aqueous or organic liquid that volatilizes away.

Instead of argon in the box, other protective gases such as nitrogen and hydrogen can be used, as described for example in U.S. Ser. No. 281,405. The foil will begin to deform at about 1050° C. and by keeping about 275° C. of that softening temperature, the heat treatment can be reduced to about three minutes. The same 275° C. below softening is also effective with other substrates such as nickel that deform at temperatures at least as high as 815° C.

Electric resistance heating, radiant heating, and even flame heating can be used instead of dielectric heating. Flame heating is preferably applied against the aluminum-coated surface of the foil using a flame fed by a gaseous combustion mixture of hydrogen and oxygen or air containing sufficient oxygen or air to enable suitable combustion, but insufficient to add a significant amount of oxygen to the atmosphere in the box.

As noted above very rapid aluminum diffusion generally produces aluminized cases of irregular depth.

The addition of about 0.5 to about 2% magnesium metal to a chromizing pack gives improved chromized cases. This is shown in the parent applications.

When a carbon-containing binder is used to hold a masking mixture in place, it can sometimes leave a little extra carbon on the substrate surface covered by the masking mixture. While such carbon deposition is not significant in substrates that contain a substantial carbon content, such deposition can be reduced or completely eliminated for substrates that contain only a small carbon content or none at all. Thus nitrocellulose and bentonite are effective binders that leave behind little or no carbon. Nitrocellulose can thus be dissolved in nitrobenzene or nitromethane, and bentonite can be mixed with water, to each form binders to which the masking powders are added to make a masking slurry or mud.

The minimizing of carbon residue is particularly desirable when masking the so-called single crystal superalloy vanes and blades for the hot section of a jet engine. The foregoing binders that do not deposit any significant carbon are accordingly particularly suited to provide slurry coatings for masking such diffusion aluminizing or masking diffusion coatings with other metals.

For best results the single crystal superalloy workpieces are masked with binder-free masking mixtures. Also for such purposes the nickel and any other metal in such masking mixtures should be free of detectable carbon. In addition the breaking in of such a masking mixture should not expose it to significant quantities of carbon. Thus the retort used for the break-in is preferably a carbon-free or low carbon content metal.

Parent Ser. No. 862,712 describes the activation of brasses with mineral acids or ammonium persulfate. Such activation of brass can also be used to activate other catalysts used for the hydrogen-reduction of CO to methane. It is particularly effective when a caustic leach is used in place of the acid leach, for activating stainless steel catalysts used with $NH_3$ or other reducing gases to reduce the NOX content of furnace stack gases where the furnace is fired with coal or oil. A stainless steel catalyst for the above purpose is in the form of a metal wire screening in which the spacings between the screen wires define passageways about 30 to about 200 mils wide. The wires themselves can have a thickness from about 5 to about 30 mils.

Such screening can very conveniently span across a flue passage so that all the flue gases pass in intimate contact with the screen wires and there is minimum obstruction to gas flow. It is generally desirable to provide a stack or series of screens in the flue, particularly where the gas velocity is high, to assure adequate contact of the moving gases with the activated catalyst.

Such a screen arrangement packs a great deal of active catalyst surface in a modest space, and will not trap too many particulates that may be carried by the gas. Thus by making the openings between screen wires about 100 mils or greater, the passage of ash particles and even some carbon flakes, is not seriously obstructed. Where a stack of two or more screens is used, the adjacent screens can be spaced a little from each other to minimize the trapping of particulates. Also with spacings of at least about 100 mils between adjacent wires, it is helpful to have pairs of screens with one screen of the pair offset from the other by about half that spacing. This helps assure that all portions of the moving gas came sufficiently close to the active catalyst surfaces.

Another feature of the use of screens, is that a screen or a pair or stack of screens can be held in place in a manner that permits turning upside-down, so that particulates trapped against the bottom of a screen by upwardly flowing flue gas can be blown off by the gas when the screen is upside-down. The catalytic screens can be generally flat members hanging vertically in the path of a laterally moving stream or a vertically moving stream of flue gases. Horizontally positioned screens can also be mounted in the path of a horizontally moving flue gas stream.

An iron-base alloy containing by weight at least about 10% chromium, preferably at least about 15% chromium provides very effective catalyst surfaces. Although pure iron or low carbon steel can be used, their catalytic efficiency is lower. The catalytic surface can contain as much as 20% aluminum by weight inasmuch as not all the diffused-in aluminum need be removed. It is preferred to only remove about 30 to 60% of the diffused-in aluminum. Energized pack diffusion will form very good diffusion cases at the crossover points of screens, where crossing wires contact each other. Thus a type 410 stainless steel wire screen is easily diffusion coated to form an aluminized case about 2 mils thick with the case thickness variations within plus or minus 10%. Upon leaching with aqueous caustic the resulting activated surface is more efficient than the activated layers described in U.S. Pat. Nos. 4,040,981 and 4,206,081. A diffusion case 1.5 mils thick gives even better results.

Pack or vapor diffusion is also a convenient technique for introducing the chromium into an iron or steel to provide the surface alloy into which the aluminum is to be diffused. Vanadium, manganese, tungsten, molybdenum, copper, titanium and tin can likewise be introduced into an iron substrate by such techniques, with or without the chromium, to also improve the catalytic action obtained after activation by the aluminum diffusion and subsequent leaching. Alternatively any or all of these adjunct metals can merely be plated on the iron substrate so that they diffuse into it during the aluminum diffusion.

EXAMPLE III

A 20-mesh screen of 16 mil thick type 430 stainless steel wire was embedded in a powder pack of 20% by weight 10 micron aluminum and 80% by weight 325 mesh alumina, with ½% by weight AlCl₃ added to the pack as energizer. Diffusion was effected in a hydrogen-blanketed atmosphere at 510° to 540° C. for 20 hours, as described in U.S. Pat. No. 3,764,371, after which the coated screen was dropped into aqueous 16 to 20% NaOH where it was reacted for 2 hours. The screen so leached was then rinsed off and shows an active microporous layer about 1.3 mils thick. It is ready for the denitrations described in U.S. Pat. No. 4,040,981 or if desired for the pre-denitration treatments described in that patent as well as in U.S. Pat. No. 4,206,081.

Other chromium-containing iron-base alloys can be similarly treated. Alloys containing more than about 50% chromium by weight are not preferred. Austenitic, martensitic and ferritic stainless steels are suitable base materials.

Instead of starting by aluminizing stainless steel screening, screening of ordinary low carbon steel such as type 1010 can first be chromized, using either a pack diffusion as in Example I or a gaseous diffusion as in U.S. Pat. No. 3,222,212.

These as well as other techniques for chromizing as well as for applying molybdenum, vanadium, titanium, copper and tungsten as well as their carbides, nitrides, borides and silicides, are described in the text Vapor Plating by C. F. Powell, C. E. Campbell and B. W. Gonser, Copyright 1955 by John Wiley & Sons, Inc. Decarburizing a steel makes it more suitable for chromizing.

As with chromium, it is preferred that the coated surface of the iron substrate contain at least 10% and not more than 50% of the molybdenum, manganese, vanadium, titanium, copper, tungsten or tin, or of combinations of these metals with or without the chromium. This concentration is only needed in the outermost 1 or 2 mils of the iron surface. During the subsequent aluminizing and leaching to activate the surface, the activated case that is formed has about 2 to 4 times the thickness of the metal depth from which it is formed. Accordingly a 1 mil penetration of chromium or vanadium, for example, will be expanded to over 2 mils in the activated product. As little as 5% of these alloying metals can be used.

The expanded surface is quite porous and also contains added aluminum, and as much as about 40% of the aluminum that is diffused in, can remain after the leaching operations. A vigorous leaching also loosens and removes most, if not all, of the very porous layer formed on stainless steel during the initial portion of the leaching, particularly if that porous layer is thicker than 1.5 to 2 mils. Notwithstanding such loosening, the resulting stainless steel is a very active NOX-reducing catalyst although its life might be shortened.

The content of chromium or vanadium or other adjuvant in the metal surface after mild leaching is only about 8/10 to 9/10 its content before activation. After vigorous leaching that removes the porous layer, the fraction drops to 5/10 or less.

Where the adjuvant metal is applied as a top plating to the iron substrate for subsequent diffusion into the iron surface, sufficient plating should be applied to obtain a subsequent penetration of at least about 0.5 mil before aluminizing, or 1 mil after aluminizing. Lesser penetrations are not as desirable, and diminish the NOX-reducing effect.

While tin can be applied to the catalytic surfaces of the present invention by any of the techniques described above, it can also be applied by having tin present in the leaching solution as described in Ser. No. 172,671. Thus dissolving 5 to 10 grams of SnCl₂.2H₂O in a solution 50 grams NaOH in 500 cc. water provides a good leach solution that leaves the leached catalyst somewhat more active than a corresponding leach solution not containing the tin.

Instead of aluminum, zinc can be used as the activating metal diffused into the iron or iron alloy substrate. It diffuses in more rapidly than aluminum so that diffusion times can be reduced about 25% and diffusion temperatures reduced about 250° C.

EXAMPLE IV

An 8 mesh screen woven from 10 mil thick 1010 steel wire is given a vanadizing treatment at 1000° C. in a stream of hydrogen and HCl that has been passed over vanadium as described on page 39 of the Powell et al text and the references cited therein, to form a 1 mil thick case.

The resulting screen is then embedded in a powder pack consisting of 15% by weight zinc powder and 85% by weight powdered alumina, to which pack ⅛% by weight of anhydrous zinc chloride is added. Diffusion is then conducted as in Example V to cause the screen to pick up about 27 milligrams of zinc per square centimeter of gross wire surface. The zincized screen is then subjected to 20% aqueous NaOH for 30 minutes, rinsed and dried, and shows an active surface layer about 2.5 mils thick. This makes a very effective denitrating catalyst with or without any of the other pre-denitrating treatments of U.S. Pat. Nos. 4,040,981 and 4,206,081.

FIG. 1 of the drawings shows the exterior of an oil-fired furnace 10 having a stack 12 partly broken away to show its interior. At the base of the stack is fitted a frame 14 holding a pair of screens 21, 22 as indicated in FIG. 2. The frame is fitted to hold the screens so that they extend across essentially the entire cross-section of the stack. The screens have their wires 31, 32 offset and a corresponding offset for their cross wires.

Frame 14 is rotatably mounted in the stack by means of pivot extensions 34, 35, and one of these extensions carries a handle 37 by which the frame can be rotated around the horizontal axis defined by the extensions. The handle also has a pointed end 39 that indicates the rotary position of the frame.

When desired, as for example when the flow of stack gases becomes excessively impeded because particulates have accumulated on the lower face of the lower screen, the frame is rotated 180°. This permits the flue gases in their upward movement to blow the accumulated particulates off that face.

Instead of rotating frame 14, it can be fitted into a groove extending around the interior of the furnace walls and penetrating completely through one wall. The frame can then be slid into position through that penetrating groove. So positioned it can then be easily removed when desired and replaced in upside-down position. Sonic or ultrasonic vibrator may be connected to the frames to delay trapping and expedite freeing of particulates. Such vibration can be also separately used to help clean a particulate-coated frame that is removed from the stack and immersed in a cleaning bath.

Two screens are generally not enough for most stack denitrations, and additional sets of screens can be used.

Also three or more screens can be fitted on a single frame. Spacing one screen from its adjacent screen by a distance at least as large as the widths of the screen openings, helps reduce the trapping of particulates on the screens. Although the screen wires are shown as round in cross-sections, these cross-sections can alternatively be square, rectangular, oval, or of any other configuration.

The screens of the present invention will reduce the nitrogen oxide content of stack gases even when little or no ammonia is present, but it is helpful to add a small amount of ammonia where not enough is present to permit the stoichiometric reaction, e.g.:

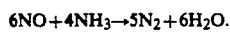

$$6NO + 4NH_3 \rightarrow 5N_2 + 6H_2O.$$

Carbon monoxide also helps the screens of the present invention reduce nitrogen oxides to nitrogen whether or not ammonia is present, and carbon monoxide is normally present in significant concentrations in combustion gases. Thus coal-fired furnaces show very little ammonia content in their flue gases, but their carbon monoxide output can be greater than their nitrogen oxide output.

The catalysts of the present invention show their greatest effectiveness at temperatures of about 315° C. or somewhat higher. It is accordingly preferred for the screens to be positioned where the stack gases have these temperatures. When the stack gases contacting these screens are at relatively low temperature, the catalytic efficiency of the screens can be increased by heating them, as by means of a small auxiliary burner mounted under them or by passing an electric current through them.

The catalytic iron and steels are pyrophoric when the leaching of the aluminum or zinc is completed. A little aluminum or zinc remains in the substrate at that point. If the iron or steel contains chromium, the pyrophoricity that is obtained decreases as the chromium content increases.

Masking of chromium-nickel-iron type stainless steels during chromizing is best effected by imbedding in compacted powder the metallic portion of which is 13 to 20 weight % chromium, 6 to 10 weight % nickel, and the balance iron, and is diluted with 1 to 2 parts by weight of $Al_2O_3$. The powder is broken in by a pre-firing. When the chromium content of the metallic portion is above about 17 weight percent, a slight chromizing can be effected right through a layer of masking powder as much as two inches thick. Such chromizing is not necessarily undesirable inasmuch as it assures that chromium has not been depleted from the substrate being masked. By avoiding depletion, the masked surface remains ductile, strong and with a somewhat enhanced corrosion resistance.

Where embedment is impractical for the masking, then masking layers can be applied from slurries in volatile solvents as described above. However a ⅛ inch layer so applied is not suitable by itself and is not compact enough to prevent major chromizing. Application over such a coating, of a second layer containing a major amount of iron powder with or without refractory diluent will effectively prevent passage of chromizing vapor to the substrate and also forms a protective sheath. A small content of chromium, about 5 weight % of the total metal content can be added to the second layer, to help assure that there is no excessive depletion of chromium from the first layer and from the substrate.

When substantial quantities of iron and aluminum, or nickel and aluminum, powders are mixed and heated, they react with each other as the temperature reaches about 480° C. and generate large quantities of heat while very rapidly forming the aluminide. Thus for continuous formation of aluminide powders, iron or nickel powders or mixtures of the two can be further mixed with the aluminum powder and then poured onto a moving conveyor of Inconel 600 for example that carries the resulting mixture through an aluminizing atmosphere where the leading edge of the mixture is heated as by a burner or oven to initiate the reaction. When the reaction starts the burner can be turned off, and when an oven is used the oven can be temperature-controlled to reduce or cut off the heat it supplies, at the time the reaction supplies sufficient heat.

Moving metal foils such as said Inconel, that withstand the reaction, make suitable conveyors although the reacted particles tend to adhere to such foils. Where the particles are carried by foils of stainless steel, low alloy steel or plain steel, the adhesion is quite pronounced, so that the reaction product is a foil to which the reacted particles are sintered. No other conveyor is then needed. The reaction can take place so rapidly that no special atmosphere is needed so that it can be conducted in air. A stream of argon can be directed over the exposed moving foil to displace most of the ambient air.

Nickel powder effects aluminide formation with more vigor than iron powder does, and also provides, after leaching out aluminum, a pyrophoric product having somewhat more pyrophoric heat output. The aluminide-forming reaction can seriously degrade the supporting foil when that foil is iron or other metal not very resistant to high temperatures. To minimize such degradation it is preferred that there be no more than about ⅔ atom of nickel for every atom of iron in the powder mixture, and that there be not over about 2.6 atoms of aluminum for every atom of iron and nickel. For the most effective pyrophoricity there should be at least about 2 atoms of aluminum for every atom of iron and nickel. A proportion of 1½ atoms of aluminum for every atom of iron and nickel reacts to form an aluminide mixture that is slow to leach and becomes only mildly pyrophoric.

The aluminide-forming reaction proceeds very quickly after the powder mixture reaches reaction temperature. Where the powder particles are about 40 microns in size, the reaction time is generally not more than about 5 seconds and for smaller particles even less time is required. The use of a supporting foil that absorbs and/or conducts away heat very rapidly such as 0.05 millimeter thick copper, can extend the reaction duration if the powder mixture is in a layer less than about 0.1 millimeter thick. Layers at least 0.1 millimeter thick are preferred where the pyrophoricity is to attain the maximum radiation temperature.

The leaching that renders the aluminide pyrophoric is preferably carried out rapidly, as by treatment with 20% NaOH or KOH in water at about 60° to 95° C. for two to three minutes. Higher leaching temperatures and/or higher caustic concentrations further shorten the leach time, but longer leach times can be used as described in the prior art.

The aluminide-forming mixture can have additional ingredients incorporated to improve the pyrophoric output after leaching. A highly exothermic combustible material like powdered boron is very useful for this purpose, and only about 1 to about 4% of such powder in the aluminide-forming mixture is highly effective. Powdered carbon, magnesium and titanium are also useful additives, but they tend to ignite when the aluminide-forming reaction is conducted in a manner that does not completely shield the reacting mixture from the ambient air.

The following are very desirable exemplifications:

EXAMPLE V

A length of SAE 1010 steel foil 1/40 millimeter thick has sprayed onto both faces a mixture of, by weight:
- 53.6 parts—325 mesh aluminum powder
- 29.6 parts—325 mesh iron powder
- 16.8 parts—325 mesh nickel powder
- 3.24 parts—325 mesh boron powder, 175.5 grams of the mixture were dispersed in 93 grams of a 4% solution of poly(ethyl methacrylate) in methylchloroform, and sprayed on in that form to apply coatings that yield a pyrophoric product about 17/40 millimeters thick overall.

The foil with the sprayed-on coatings was then air-dried for about one minute and the thus-dried product passed through the heated tube of a tube furnace. The tube is about 25 centimeters long and heated to about 700° C., and a slow stream of argon is introduced into the open-ended tube as the foil passes through. Part way through the tube the coated foil becomes red hot, and on emerging about 40 seconds later is has begun to cool down.

The cooled product is passed through a heated 20% solution of NaOH in water. With the solution between 60° and 95° C., only about 2 to 3 minutes in the solution yields a leached product having an exceptionally high degree of pyrophoricity. That product, which is about 17/40 millimeters thick, is further improved by rolling it down between pressure rollers to a thickness of about ¼ millimeter. Rolling to reduce thickness of the coating by about ¼ to about ½ gives best results when effected before leaching. Also such rolling is most effective when conducted before the hot freshly-reacted coating cools too much, although it works well when the cooling is almost complete.

The pyrophoric product is also improved by subjecting it, before or after rolling, to the post-treatment with citric acid or other mild acid as described in parent Ser. No. 28,741, the contents of which are incorporated herein as though fully set forth. The magnitude of the resulting improvement diminishes as the nickel-to-iron proportion increases.

The coating mixture can be applied by other techniques, such as by roller coating or by dipping the foil in a suspension of the coating mixture, or by merely pouring the powdered mixture on a surface of the foil while the foil is held with that surface extending in a horizontal plane. The binder content in the coating mixture can be reduced and even completely eliminated, particularly where only the upper face of the foil is coated. Such a one-sided coating can, after the aluminide formation, be repeated on the other face of the foil if desired.

The pyrophoric material is quite porous both before and after rolling, and can be impregnated with liquid or powdered materials as above noted that also improve the pyrophoricity, as by adding exothermic heat and/or varying the spectral response of the pyrophorically heated material.

Reducing the boron content of the original mixture to 1 part by weight, reduces the pyrophoricity somewhat. Eliminating the boron altogether, further reduces the pyrophoricity. Increasing the boron content to 6 or as much as 20 parts by weight increases the pyrophoric heat output. Powdered magnesium and/or titanium behave similarly.

It is preferred to incorporate the foregoing additive in the original powder mixture inasmuch as this reduces the intensity of the aluminide-forming reaction. However the additives can alternatively or additionally be incorporated in the leached product, as by suspending the additives as finely-divided powders in a liquid like water, and slurrying such suspension over the leached product.

The aluminide-forming reaction can alternatively be moderated by reducing the content of the nickel powder, reducing the content of the aluminum powder, or by adding diluents such as pre-formed iron or nickel aluminides as disclosed the parent applications.

Increasing the nickel proportion or the aluminum proportion beyond the limits set out above makes the aluminide-forming reaction so vigorous that it causes the degradation of an iron foil on which the reaction takes place. It appears that such iron foil becomes aluminized and embrittled, as well as weakened by the high temperature of the aluminide-forming heat generation. The resulting foil breaks and falls apart fairly readily.

An iron foil 1/20 millimeter thick withstands such degradation a little better than a foil half as thick, but it is preferred to keep within the limits set out above, even for the thicker foil.

EXAMPLE VI

A mixture is prepared of the following powders, each about 10 microns in particle size:
Iron—One atom
Aluminum—2.5 atoms
Copper—0.1 atom, This mixture is dispersed in the binder solution of Example V, sprayed onto both faces of its steel foil about 2.5 centimeters wide and about 25 microns thick and subjected to heat-induced reaction and subsequent leaching as in that example. The resulting product is illustrated in FIG. 3, and shows very good adhesion between the aluminide particles 50 as well as between those particles and the foil 60. On flexing this product much fewer particles break off as compared to the corresponding product of Example VII.

Rolling of the FIG. 3 product before or after leaching between steel rollers 9 centimeters in diameter biased toward each other by a force of 20 kilograms, compacts the product to the still-porous condition illustrated in FIG. 4 in which its thickness has been reduced from about 425 microns to a compact 250 microns. In general such compacting is very desirable and/such aluminide coatings are preferably compacted to about half to ¾ of their original thickness.

The addition of 1 to 20% powdered boron to the initial powder mixture as in Example VII, or to the aluminide reaction product before or after leaching or after compacting, substantially increases the pyrophoric heat output of the product.

Omitting the copper from Example VI reduces the adhesion of the iron aluminide particles or of nickel aluminide particles to iron and steel foils. At least about 1/30 atom of copper for each atom of iron and nickel, will provide such increased adhesion, and more than ⅛ atom of copper is not desirable.

A particularly desirable technique is to apply to a one-mil thick foil of 1010 steel, a dip coating having the following powders:
222 g. Al
207 g. Fe
75 g. Cu
5 g. B dispersed in 100 g. acetone in which is dissolved 10 grams of polyethylacrylate.

After drying, the coating is about 20 mils thick on each face of the foil, and the coated foil is subjected to the heat treatment and leaching of Example V to produce a very effective pyrophoric product.

The same treatment can also be applied to ½ mil thick type 302 stainless steel, preferably after the coating dispersion is thinned with an additional 15 grams acetone.

Foils of low alloy steels, i.e. iron alloyed with not over 5% other metals, behave like SAE 1010 steel and like Armco iron, in respect of their poor resistance to the aluminide-forming reaction heat.

The hot aluminide-carrying foil can be directly introduced into the leaching bath before the foil cools down to the bath temperature. Due to its large surface-to-mass ratio, only about 15 to 20 seconds cooling will get it down to a temperature at which it does not cause violent localized boiling as it enters the bath, particularly if the cooling is aided by a blanketing stream of cool protective gas like argon or nitrogen. The leached product is preferably between about 0.3 and 0.7 millimeters thick. The activated foils can also be prepared by applying on a metal foil or gauze carrier, as by Schoop spray, an adherent coating of iron and nickel aluminides having a sufficiently high aluminum content, and then subjecting such aluminide-carrying webs to the leaching treatment that extracts aluminum and develops pyrophoricity. Inasmuch as the leaching reduces the adhersion, the coated web is preferably heat treated at a temperature of 700° C. or higher to increase the adhesion before leaching. It is also preferred to keep the aluminum proportion to between 1½ and 2 atoms for every atom of iron and nickel. Before leaching, the coated web can be between about 25 and about 400 microns thick, but thicknesses not over about 50 microns are preferred inasmuch as they leach through much more readily. The foil or gauze should be as thin as practical, generally less than 25 microns thick.

The leaching should remove about ½ to about ¾ of the aluminum in the aluminide, or should proceed until the leaching reaction slows down to an insignificant rate. Thus a 13 micron thick iron foil coated with $FeAl_2$ to a total thickness of 50 microns will be adequately leached through in about 5 minutes or less by a 20% solution of NaOH or KOH in water at a temperature at least as high as 60° C. At boiling temperature or with higher concentrations of caustic, the leaching only takes about two minutes.

After leaching, the leached web is pyrophoric and should be kept out of contact with oxygen or air until ready for use. It can be rinsed with water and then subjected to the mild acid treatment of Ser. No. 28,741 as noted above.

The leached foil is sufficiently porous to pick up 1 to 2% very finely divided boron powder from a slurry in water or methylchloroform. Adding about 1% resin binder to such slurry helps with the boron pick-up and also causes some boron powder to adhere to the outer face of the foil.

Alloying from about 1 to about 10% boron in the original aluminide foil makes it unnecessary to add boron by an after-treatment. Such alloying can be conventional melt alloying, or diffusion boronizing.

Before or after activation the foils can be cut into strips suitable for use as heat-seeking missile decoys. Cutting after activation is preferably conducted under water or in an argon or nitrogen box.

Alternatively small strips of the original aluminide foil can be prepared and they can be leached as by loading them in a perforated basket which is then lowered into the leaching bath for the appropriate time. Upon completion of the leaching, the strips can be rinsed as by lowering the basket into rinse water. After the rinsing the basketful of strips can be dipped into the mild acid bath that increases their pyrophoricity, and then again rinsed.

The original small strips of foil can be prepared for treatment by cutting up a long foil or by forming the strips from molten aluminide as described for instance in U.S. Pat. No. 4,755,353.

A particularly desirable technique for improving the spectral response of a pyrophoric web is to provide a face of the web with a highly specular surface which in turn has its external face coated with an alkali metal silicate. The highly specular surface can be polished metals like stainless steel, copper, aluminum or silver and should have a specular reflection of at least about 70% to red light. The alkali metal silicate preferably has an $SiO_2:M_2O$ mol ratio between about 2 and about 5, and should be at least about 10 microns thick.

Where the pyrophoric web already contains a specularly-surface metal foil like stainless steel, the alkali metal silicate can be applied directly to that specular surface. Sodium or potassium silicates having a 3.22 mol ratio are very effective.

The specular surface can be provided by cementing a specularly-surfaced foil to a face of the pyrophoric web, or by metallizing that face with aluminum at high vacuum. High vacuum deposited aluminum flakes are available in the market place and can be deposited from suspension in a binder-containing volatilizable liquid. An aqueous solution of the alkali metal silicate can be used as a cementing material or as the above-mentioned binder. The face of the pyrophoric web to which a separate specular surface is applied, can be the face of the pyrophoric aluminides before or after rolling, and before or after leaching can be the face of a supporting foil or screen. Where a specular foil is applied, that foil should be very thin, less than about 25 microns thick.

A little boron or chromium oxide can be suspended in the alkali metal silicate to further improve the spectral response, as described infra.

As noted, the supporting foil or screen can be a highly exothermic easily ignitable metal such as zirconium or titanium, whether or not any spectral-response-adjusting coating is applied.

The ignition temperatures referred to above are the lowest temperatures at which the metals there discussed ignite in air. Pyrophoric metals react and ignite at extremely low temperatures and are accordingly not considered as having an ignition temperature. When an ignition temperature is mentioned it is accordingly in connection with a material that is not pyrophoric. Carbon and boron, both of which are ignited by the pyrophoric metals, can be considered ignitable metals for the above purposes.

The radiation characteristics of a burning carbon fiber web are also improved by coating it with borosilicate or borochromate particles in which the boron oxide content is from about 5% to about 50%.

About a 1/10 to 15-mil thick layer of pyrex glass particles ground to about 200 mesh and adhered to one face of a 5 to 30-mil thick carbon fiber cloth, provides a radiation pattern particularly desirable for decoying heat-seeking missiles. A little binder solution such as that used in connection with Example V can be used to secure such coating in place, so that all that is needed is to spray on the binder solution containing the powdered glass particles suspended in it, and then permitting the sprayed-on coating to dry.

The sizes of the individual glass particles should be from about 10 to about 100 microns.

A further improvement in the foregoing radiation characteristics is obtained when a layer of aluminum particles is interposed between the powdered glass coating and the carbon fiber cloth. Such aluminum layer can be from about 1/10 to about 1-mil thick, can consist of aluminum particles also about 10 to about 100 microns in size, and can be applied the same way described above for the glass particles. Drying of the binder-containing aluminum particle layer permits the spraying over it of the glass particle layer without excessive smearing of the aluminum particles. Aluminum alloys containing at least about 80% aluminum can be used in place of pure aluminum.

A very effective coated and self-igniting carbon fiber cloth is prepared by starting with a 16-mil thick cloth that is activated by pitting and coating with lead acetate in accordance with the prior art. On one face, there is applied a ½-mil thick layer of aluminized particles, which is dried and followed by a 11.5-mil thick layer of particles of the following glass composition, by weight:

72%: $SiO_2$
25%: $B_2O_3$
0.5%: $Na_2O$
1%: $Al_2O_3$
1%: $K_2O$
0.5%: $Li_2O$.

The resulting material is dried again and is now placed in an argon box. While in an argon atmosphere the uncoated cloth face is sprayed with a 16.5-mil thick layer of 325 mesh pyrophoric iron particles, dried and the pyrophoric layer then top-coated with a 0.5-mil thick layer of the same glass particles previously applied. Another drying step, still under argon, completes the product. When that completed product is exposed to air, its pyrophoric coating promptly ignites and then ignites the carbon fibers of the cloth. The entire cloth burns away and in doing so very effective radiation is generated.

The last borosilicate layer can be omitted without seriously detracting from the radiation effectiveness.

Another borosilicate that can be used is a simple pyrex formulation of:

80.6%: $SiO_2$
13.8%: $B_2O_3$
4.0%: $Na_2O$
1.6%: $Al_2O_3$.

Simple mixtures of $B_2O_3$ and $SiO_2$, as well as of $B_2O_3$/and $Cr_2O_3$ are also effective, but are not as effective unless sintered or fused together.

Melt alloying iron with sufficient aluminum to make an aluminide ranging from $FeAl_2$ to $FeAl_3$ and with 5 to 20 percent of boron by weight of the iron, provides a product that can be ground and readily leached of sufficient of its aluminum to give a very effective pyrophoric powder. A correspondingly made nickel alloy is similarly suited. The radiation effectiveness of such powders, as well as of the boron-containing products of Examples VII and VIII, is improved by adding some silicon or silicon dioxide, preferably as a surface coating. In general, the boron to silicon ratio should have about 5 to about 50% boron.

The pyrophoric particles or the porous members carrying such particles are effective solid fuels that can be injected into turbine engines to burn and thus operate such engines. For this purpose the particles and the porous members should be very finely divided so that they burn rapidly. In order to simplify the storage of the particles, their surfaces can be coated or impregnated so as to prevent pyrophoric action until after the particles are injected into the engine intake where the elevated temperatures normally at the intake will then cause the particles to ignite.

Thus the particles can be dipped in liquid perfluoroalkane having a boiling point of 215° F., then removed from the liquid and dried by rolling them over paper towels, or blowing argon over them, until they appear to be free of surface liquid. Notwithstanding that appearance, the particles do not spontaneously ignite when merely exposed to air, even upon ten days exposure to air.

However when exposed to air and heated to about 150° C. they promptly ignite and then go through a complete combustion. At this ignition temperature it appears that residual liquid in the porous surface of the particles is driven off to permit the pyrophoric action.

Similar results are obtained with hydrocarbons or other relatively inert liquids that have boiling points of at least about 200° C. Paraffin wax also behaves similarly but requires a temperature of at least about 250° C. to be ignited. Pyrophoric iron or other metal powders so treated make particularly desirable solid fuels for turbine engines which have compressor sections that operate at temperatures sufficiently high to effect the foregoing ignition. Such metals can be relatively soft so that they do not excessively erode the engine as they move through it. Alloying boron or carbon or both with these metals increases their hardness but gives less erosive combustion products. It is accordingly preferred to add carbon as finely divided graphite particles, or as graphite coatings on the pyrophoric particles.

For engines in which the intake temperature is at least as high as 300° C., pyrophoric action is so markedly accentuated that more than 30 weight percent boron can be alloyed with iron or nickel that is subsequently pyrophorically activated, without swamping out the pyrophoricity. The boron content can be increased to about 50 to 60 weight percent for still higher intake temperatures. It is preferred to have no more than about 70% boron in such an alloy inasmuch as at higher concentrations the boron burns to a stiky liquid boron oxide that coats the surfaces of the burning particles and seriously hinders or prevents further combustion.

Palladium is best catalytically activated with zinc. A simple diffusion of about 1 to 30 milligrams of zinc per square centimeter of palladium surface, followed by leaching with strong at least 10%, HCl in water at 95° C., produces from a 1 mil thick foil a very effective catalyst. A typical pack diffusion treatment for palladium is the embedding of a 52-mesh palladium screen the wires of which are 4 mils thick, in a pack of 20% powdered zinc and 80% alumina, energized with ½% NH$_4$Cl, and heating for 4 hours at 315° C. in a hydrogen-bathed or argon-bathed atmosphere. This effects a zinc pick-up of 4 mg/cm$^2$, essentially all of which is leached out by 20% HCl in 10 minutes. The resulting screen is pyrophoric when exposed to air.

Zinc can be similarly diffused into titanium foil in a hydrogen-bathed or argon-bathed atmosphere from such a zinc-containing pack. As an example a 4 mil thick titanium foil is embedded in a pack having the following composition:

80 g: Zn
16 g: Al
305 g: Al$_2$O$_3$
4 g: AlCl$_3$.

and subjected to 10 hours of diffusion at 510° to 540° C. The foil picks up about 3.5 milligrams of zinc per square centimeter. It is worthy of note that the titanium does not become seriously embrittled by such treatment, and can be bent around a ⅛-inch radius without cracking. The diffused-in zinc can be leached out with 20% boiling NaOH solution to leave a very active catalytic surface. Titanium activated this way still retains a little of the zinc and can be used as a conventional electrolysis electrode, or as a substitute for the photosensitive electrodes described in the Augustynski et al paper in the Journal of the Electrochemical Society, Volume 124, No. 7, pages 1063-64 (1977).

Titanium activated by aluminizing and leaching can also be so used. Such titanium, still containing a little of the aluminum, can be heated in air or under other oxidizing conditions to convert some of its porous activation case to mixed titanium aluminum oxides and such a treated titanium makes a very effective photo-anode for photolysis of water containing a little NaOH. Even without the heat-treatment it is a very good photo-anode. Tin can also be diffused into titanium to provide similar results with and without the subsequent oxidation.

Whether the zincized, aluminized or stannized titanium is used as a photo-electrode, a platinum or platinized platinum or activated platinum counter-electrode is helpful. Activated platinum made as described in U.S. Pat. No. 4,154,705 is particularly helpful. A little ruthenium, such as 1 to 5% by weight can be incorporated in the titanium before it is aluminized, zincized or stannized, as a further improvement.

Instead of using separate electrodes for the photolysis, they can be provided in powdered form and mixed with each other as well as with other substances such as cadmium sulfide that also help with the photolysis.

Hydrogen proxide appears to form during the foregoing photolysis and some exothermic heat is also generated and can be used to help keep the photolysis combination warm.

The pyrophoric effects of the Raney-type activated metals is improved by diffusing boron into the Raney surface before it is activated. This is shown in the following example:

EXAMPLE VII

Three-hundred grams of powdered 325 mesh FeAl$_2$ is thoroughly mixed with 10 grams powdered boron and 6 grams of powdered NaBF$_4$. The mixture is placed in a carbon steel retort which is then fitted into a tube furnace, and heated while a flushing gas is passed through the tube as in Example 1. A heat of 980° C. held there for 1½ hours under hydrogen, introduces about 7% boron into the FeAl$_2$ powder, based on its iron content.

The retort contents are partially sintered together as a result of the diffusion heat, but can be fairly easily removed from the retort after banging the outside of the retort with hammers or mallets. Crushing and/or grinding readily reduces the mass to very small particle size. Then on leaching aluminum out of the resulting product mass as by a 60-minute treatment in 15-16% aqueous NaOH that is cooled to keep it below 50° C. followed by washing, the activated particles remaining are quite pyrophoric and on exposure to air heat up to temperatures of about 540° C. Higher and lower leaching concentrations and temperatures can also be used, but are less desirable.

Longer diffusion boronizing provides, after leaching, an activated iron-aluminum-boron alloy powder containing as much as 30% boron based on the weight of its iron, and which upon exposure to air heats up to over 650° C. Boron contents greater than about 30% provide decreasing heat-up and at about 40% leave the leached powder non-pyrophoric. It is preferred that the boron penetrate through the entire thickness of each powder particle and that each particle have a uniform composition throughout its thickness.

Similar results are obtained when FeAl$_3$ powder is used in place of the FeAl$_2$, when alloys of intermediate proportions are used, and when the corresponding nickel-aluminum alloys are used. Some of the alloys are not as brittle, and therefore not as easily grindable as others. If the iron-aluminum alloy powder particles being boronized are over about 1 millimeter in size, the boronizing treatment times should be substantially lengthened if the boron penetration is to be complete. Other boronhalides such as ammonium fluoborate, BBr$_3$ and BI$_3$ can be used as energizers. In general the energizer content of the pack should be from about 1 to about 3% by weight, and the diffusion temperature at least about 760° C.

By not using an inert refractory diluent in the boronizing pack, it becomes unnecessary to later separate such diluent from the boronized powder.

The foregoing boronizing of self-supporting substrates such as foils requires much more care and should be conducted with inert refractory diluent in the pack. Thus conducting the same boronizing on lengths of one-mil thick aluminized iron foil is awkward because such foil is extremely brittle and difficult to handle. The following is a preferred example.

EXAMPLE VIII

Such boronizing can be satisfactorily effected in the following powder pack:
  200 grams powdered alumina
  10 grams powdered boron
  5 grams sodium or ammonium fluoborate,
at 510° C. for 18 hours, or at 565° C. for 3 hours, in a hydrogen-bathed atmosphere. The boron the penetrates about half way through the aluminized case.

Aluminum loss to the boron in the pack also takes place. The aluminizing of an iron-boron alloy in an attempt to introduce sufficient aluminum to give a pyrophoric product after leaching, causes excessive loss of boron from the substrate to the pack.

The activated powders containing boron, or even free of boron, are stored out of contact with air or oxygen to preserve their pyrophoricity. Water is not a suitable preserving liquid for the activated boron-containing powders. Acetone preserves them for at least three weeks, as does an azeotropic mixture of Trifluoro-trichloro ethane with methylene chloride, described in U.S. Pat. No. 2,999,817. Ordinary fluoro-chloro ethanes and methanes that are normally used as refrigerants or propellants are also suitable and they can be used by themselves or mixed with each other or with acetone. Mixtures of the activated powders with preserving liquids that are also propellants, are particularly desirable in that they can be packed in an aerosoltype container from which they are readily discharged to provide a cloud of pyrophorically oxidizing particles.

Titanium can also be aluminized and/or boronized by the same type of treatments, to make it more resistant to corrosive attack. For this purpose the aluminum is not leached out. It is also very desirable to diffusion coat titanium in the absence of hydrogen and in the complete or substantially complete absence of conventional halide activators like AlCl$_3$ and NH$_4$Cl. Thus engine compressor blades made of Ti6A14V can be embedded in a pack of 20% Al-Si alloy powder containing 12% silicon, and 80% alumina, completely free of energizer, and at 700° C. for 14 hours under argon, acquires a protective aluminide case 0.5 to 1 mil thick. Using pure aluminum instead of the Al-Si alloy reduces the case thickness by about half.

Adding ¼% AlCl$_3$ or NH$_4$Cl energizer to the pack causes the titanium substrate to be significantly embrittled. However the aluminizing can be speeded by using a pack that had been pre-fired with such a halide energizer for a time long enough to drive out essentially all the energizer—at least one to two hours at 370° C. or higher. It appears that some energizer remains or some change is caused, to make the pre-fired pack much more effective in aluminizing the titanium. In any event the resulting aluminizing produces thicker cases, and can be readily effected at temperatures as low as 535° C. or in times as short as 5 hours.

The addition to the pack of about 1/10% of a titanium halide such as TiCl$_2$, preferably sealed in a polyethylene tube so as to be protected against exposure to the atmosphere, is also helpful to speed up the diffusion coating. The polyethylene tube melts before the pack reaches diffusion temperature, releasing its contents.

The aluminized titanium compressor blades can then be boronized instead of or before applying a top coating as described above. A suitable boronizing pack for this purpose is a diluent-containing pack otherwise corresponding to that of Example VII, using ammonium fluoborate as the energizer and with added titanium powder in an amount about half the amount of boron powder, by weight. A 0.3 mil boronized case is thus formed at 580° C. for 14 hours in argon. The titanium powder helps keep the titanium substrate from being attacked by the halide in the pack, and can also be added to the pack used for aluminizing titanium. It can also be omitted, particularly when only a thin diffusion coating is desired. When the powdered titanium is used, it can range from about 1/5 the boron content to about equal the boron content by weight. Boron being a very high melting material, it can be used with little or no refractory diluent, particularly at diffusion temperatures low enough to keep the workpiece surfaces from reaching a sintering condition. On the other hand, the boron content of a boronizing pack can be as low as 2%, although at least 4% is preferred. To be sure that no sintering takes place an inert refactory diluent like Al$_2$O$_3$, kaolin or MgO can be present in the pack in a concentration of at least 30%.

The re-use of packs containing sodium fluoborate energizer can be complicated by the gradual build-up of sodium fluoride with each use. This problem does not appear to arise when ammonium fluoborate is the energizer.

According to a modification of the present invention, there is first prepared an alloy of aluminum containing relatively small amounts of other metals to be coated on to a substrate. This pre-prepared alloy contains sufficient aluminum to bring its melting point down to 1800° F. or below, preferably 1400° F. or below. It can then be readily flame-sprayed on a workpiece, or the workpiece can be dip-coated in the molten alloy, and if desired the resulting coated workpiece heated in a protective atmosphere to improve the bonding. A diffusion coating activator like NH$_4$Cl or NH$_4$HF$_2$ can be used to help generate the protective atmosphere.

After the coating is completed, the coated workpiece is then dropped into a leaching bath that dissolves out most of the aluminum from the coating. Where some specific amount of aluminum is desired to be present in the coating after the leaching is completed, the leaching is terminated before the residual aluminum content drops too low.

After the completion of the leaching the workpiece has the desired coating, but the coating is in a microporous condition due to the voids introduced where the aluminum has been leached out. In such condition the coating is particularly receptive to receiving and anchoring top layers such as ceramic thermal barriers applied over jet engine vanes and blades.

Cobalt also provides a suitable porous undercoat when applied and then rendered porous. While iron is quite similar in its characteristics, the leaching of iron-aluminum undercoating should be quite limited inasmuch as heavy leaching leaves the porous iron residue poorly adherent to the substrate.

As described in the parent applications, the pyrophoric action of pyrophoric members can be increased by placing in intimate contact with the member, a solid or liquid that undergoes an exothermic reaction when heated. Metals like magnesium and titanium, and even boron, can thus be adhered to a pyrophoric foil as by placing a magnesium ribbon over an activated foil and passing the assembly between a pair of pressure rollers. Powdered materials such as magnesium, titanium, manganese, zirconium, carbon, aluminum or boron can be dispersed in a volatile liquid and the dispersion applied to an activated member and dried. Commercially available boron powder is very effective when dispersed in an alcohol such as ethanol.

Such pyrophoric combinations need not be in the form of very thin coated foils, and can take other forms. Thus a 5-mil thick felt of boron or carbon fibers or ordinary paper or cotton cloth can be coated on one or both sides with a paste of pyrophorically activated iron or nickel powder, and the coated felt subjected to a drying and if desired a sintering treatment to form a self-supporting sheet in which the pyrophoric particles are embedded in the inter-fiber spaces. A boron felt weighing about 0.1 gram per square centimeter of gross surface (as measured with a ruler), carrying 0.2 gram pyrophoric iron powder per square centimeter of gross surface, generates a very large amount of heat when exposed to the atmosphere. Ordinary steel wool also makes a very effective porous substrate for impregnation.

The activated iron powder is readily prepared by activating the surface of an iron foil or sheet and scraping off the activated layer. Raney iron can also be used. Activated nickel powder can be prepared the same way but the scraping is much more difficult and it is accordingly preferred to use Raney nickel powder or to leach powdered $NiAl_3$ with alkali.

Instead of making a pyrophoric combination by starting with a sheet of felted fibers, the starting material can be a porous sheet or disc prepared as by a sintering operation so as to contain at least about 20% voids. The voids are then impregnated with pyrophoric or combustible particles as by merely applying to the sintered sheet or disc a slurry of the particles suspended in water or other volatile liquid. The presence of 1 to 5% resin binder in the liquid, based on the weight of the suspended particles, helps retain them in place after they are impregnated into the pores. Such particles are preferably about 1 mil or less in thickness, and the pores at least about 3 times the particle size. The porous sheet or disc can thus be sintered from particles at least about 10 mils in diameter so as to contain such large voids.

Alternatively the pyrophorically activated particles can be mixed with the non-pyrophoric combustible particles and the mixture thus sintered into the desired finished structure. In this modification powdered 100 mesh magnesium is for example mixed with one-half to twice its weight of minus 180 mesh pyrophoric iron or nickel powder, and the mixture first compacted under argon at 10,000 pounds per square inch into a disc about 5 mils thick, and then sintered at about 600° C. Only about 30 minutes at that temperature is sufficient. Higher temperatures can be used with other materials, but may cause excessive thermal deterioration of the pyrophoric particles and should be limited to shorter times.

Other particles such as of boron, zirconium and the like can be included in the mixture being sintered, even though these other particles do not significantly sinter together under the sintering conditions, so long as they are not in such large proportions as to prevent the sintering of the sinterable particles. For the greatest thermal output a high boron content is desired, at least 20% by weight, and some easily ignited metal such as magnesium, titanium or zirconium can be used to be more readily ignited by the pyrophoric particles. Because the non-pyrophoric particles act as heat sinks, the content of pyrophoric particles should be at least ⅓ by weight in order to reach the necessary ignition temperature, at least in one portion of the sintered member. Pyrophoric nickel particles are somewhat more effective than pyrophoric iron particles in igniting non-pyrophoric particles.

The compacted and/or sintered mixtures can be made using pyrophoricity-developing particles that are not leached until the compacting and/or sintering is completed, but the products produced this way are less effective.

The non-pyrophoric coating ignited by a pyrophoric substrate can be of the type that exothermally reacts in the absence of atmospheric oxygen. Thus the coating can be picric acid or a thermite mixture of finely divided aluminum and iron oxide powders, or ammonium dichromate, or gunpowder or a mixture of finely divided iron or boron with sodium nitrate or chlorate. Such a coating only about 1 or 2 mils thick on a pyrophorically activated iron or nickel foil about 2 mils thick, is ignited by the pyrophoric action when the coated foil is discharged into the thin air at altitudes of about 30,000 to 50,000 feet, and then generates supplemental heat more effectively than the pyrophoric action at those altitudes.

A little resin binder may be used to help hold such exothermic coatings in place, although soluble materials can be adherently deposited from solution in a vaporizable solvent such as methanol or water, and the solvent then vaporized off.

The foregoing exothermic coatings that react in the absence of atmospheric oxygen, can also be effectively applied to the above-discussed discs.

The sintered products can have their pyrophoricity blocked by the same coatings or atmospheres used to preserve pyrophoric foils. Moreover by combining two different types of coatings, enhanced blocking effects are obtainable. Thus dipping an activated iron or nickel foil in a 30% aqueous dispersion of colloidal silica, followed by removal and drying of the dipped foil, leaves a foil surface that more slowly generates pyrophoric heat. The heat dwell is made a few seconds longer and the peak temperature reached can be almost 100° F. lower. However when 10 to 90% of the silica in the dispersion is replaced by the triethanolamine chelate of diproproxy titanium, the pyrophoricity-blocking effect is much more pronounced. The heat dwell can then be extended about 40% while the peak temperature drops a little over 200° F. A mixture of about 2 parts silica and about 3 parts chelate, is preferred.

The foregoing chelate has the formula

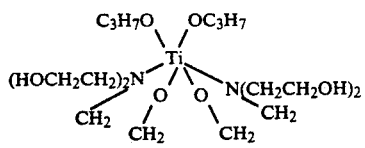

Triethanolamine, diethanolamine or monoethanolamine can be mixed with the colloidal silica to give effects similar to those of the chelate, and colloidal alumina can be correspondingly substituted for the colloidal silica, as can colloidally-sized, i.e. submicron-sized, particles of other inert solids.

The leaching after compacting and sintering to make pyrophoric masses, is particularly desirable for the making of masses such as discs or ribbons whose pyrophoric action is desired to have a long duration. This is illustrated in Example VIII.

EXAMPLE VIII

A mixture of carbonyl iron powder with an equal weight of fine aluminum powder is pressed together and sintered as described in U.S. Pat. No. 3,379,635 to form a disc about 50 mils thick. The disc is then leached with hot 30% NaOH solution over-night to yield a pyrophoric porous article which when exposed to air generates heat for about two minutes.

The maximum temperature developed at the disc's surface is only about 400° F., but this temperature can be increased by impregnating the porous disc with material that is rendered exothermic by the pyrophoricity. Thus an aqueous suspension of micron-sized powdered zirconium can be poured on the porous disc to cause the fine zirconium particles to lodge within the disc's pores. On drying the pyrophoric heat generation ignites the zirconium so that the maximum temperature of the disc's surface goes well above 400° F.

Powdered boron is a very effective heat generator but ignites at a temperature higher than zirconium does. Impregnating the foregoing porous disc with a mixture of 5 weight % zirconium and 5 weight % boron, based on the weight of the unimpregnated disc, yields a very effective pyrophoric combination however, in which both the zirconium and the boron burn upon exposing the impregnated disc to air.

A feature of the construction of Example VIII is that the pyrophoric product made, whether or not impregnated, is very inexpensive to prepare. The total cost of the ingredients is quite small, and the compacting and sintering steps are not expensive. No diffusion coating is needed and the sintering can be completed in as little as 30 minutes. An inert or reducing atmosphere is preferably used for the sintering.

Nickel powder can be substituted for the iron powder in the compacts, but is preferably mixed with 1½ times its weight of aluminum powder. A 50-mil thick disc press-sintered from such a mixture and then leached 14 hours with hot 20% aqueous NaOH is more pyrophoric than the leached iron-aluminum disc of Example 1 but its pyrophoricity does not last as long. Such a leached nickel-aluminum disc can have its pores impregnated with inert particles such as the alumina and silica mentioned supra, to stretch out its pyrophoric heat output. On the other hand it can be impregnated with heat generating materials to further accentuate its high heat output. It will for example ignite micron-sized boron particles without the need for the low-ignition-temperature zirconium.

The press-sintered masses can be made thicker or thinner than 50 mils. Making them 10 mils thick for example, makes them sufficiently light in weight so that they will fall through the air relatively slowly, particularly if the discs are 1½ inches or more in diameter. A group of such discs can then be discharged in the air to act as an effective decoy for heat-seeking missiles. Their effectiveness as a radar decoy is improved if the discs are given a plating of copper or silver on one or both faces. Not more than about 0.1 mil of such plating is needed. Electroplating is preferred over electroless plating.

The pyrophorically-active discs also have good catalytic properties. For catalytic use it is generally safer to first eliminate the pyrophoricity, as by treatment with $H_2O_2$ and water as described in U.S. Pat. No. 4,443,557. An active platinum disc made by the press-sintering technique is also a very good catalyst after leaching, but eliminating its pyrophoricity is best effected by contacting it with hydrochloric acid or other mineral acid, dilute or concentrated. Catalytic platinum prepared this way has the added advantage that its content of contaminants such as carbon or iron can be kept extremely low. When preparing such catalytic platinum with an aluminum-diffusion step, the diffusion retort used to contain the diffusion materials tends to diffuse some of its constituents into the platinum. Carbon is thus frequently found in platinum and superalloys that have been given a diffusion treatment in a steel retort. The use of a diffusion-coating retort made of nickel containing less than 0.1% carbon, does prevent such carbon contamination.

When a carbon-containing binder is used to hold a masking mixture in place, it can sometimes leave a little extra carbon on the substrate surface covered by the masking mixture. While such carbon deposition is not significant in substrates that contain a substantial carbon content, such deposition can be reduced or completely eliminated for substrates that contain only a small carbon content or none at all. Thus nitrocellulose and bentonite are effective binders that leave behind little or no carbon. Nitrocellulose can thus be dissolved in nitrobenzene or nitromethane, and bentonite can be mixed with water, to each form binders to which the masking powders are added to make a masking slurry or mud.

The minimizing of carbon residue is particularly desirable when masking the so-called single crystal superalloy vanes and blades for the hot section of a jet engine. The foregoing binders that do not deposit any significant carbon are accordingly particularly suited to provide slurry coatings for masking such diffusion aluminizing or masking diffusion coatings with other metals.

For best results the single crystal superalloy workpieces are masked with binder-free masking mixtures. Also for such purposes the nickel and any other metal in such masking mixtures should be free of detectable carbon. In addition the breaking in of such a masking mixture should not expose it to significant quantities of carbon. Thus the retort used for the break-in is preferably a carbon-free or low carbon content metal.

The MCrAly and MCrAlZr coatings can also be prepared as described infra, by interracting the powdered metals of which they are composed. The aluminum component causes an exothermic aluminide generation. It is sometimes helpful to have a little extra aluminum in the powder mixture to make sure all of the other metals are aluminided, and if necessary to then leach the aluminided material to remove excess aluminum. Up to about 50% excess aluminum can be employed in this manner.

Such in situ aluminide formation can be practiced on jet engine hot section airfoils or the like, to provide a coating about as protective as the prior art MCrAly and MCrAlZr coatings, and without using plasma or evacuation techniques.

Iron foils are very inexpensive starting materials from which to make the decoys, and they can be activated on one or both of their surfaces. The degree of activation is such that the foil thickness after activation is about 2 to 3 times its thickness before activation. When starting with an unactivated foil as thin as about 1 or 1½ mils, and as thick as about 3 mils, the activated and corrugated or accordion-folded foil will, when ejected in masses of about 1000 or more each about 2 to about 5 centimeters long and about 1 to about 3 centimeters wide, fall through the air in a trajectory that is very effective for decoy use. Such trajectory is steeper at altitudes of 8 kilometers than at sea level, but is suitable at both altitudes as well as at intervening altitudes.

Instead of iron foils other types of pyrophoric or pyrotechnic webs can be used. Nickel foil works about the same way as iron foils but generally shows a somewhat steeper temperature rise and shorter heat-generating dwell along with a higher temperature peak. Woven carbon fiber cloth has a lower density than metal and for use as a missile decoy is preferably about ½ to about ¾ millimeters thick. Such cloths can be impregnated with pyrophoric powder in sufficient quantity so that when the impregnated cloth is exposed to the air, the pyrophoric powder ignites spontaneously and then ignites the cloth.

Alternatively, the carbon fiber cloth can be ignited with a pyrophoric liquid, an aluminum alkyl for example, by packing a quantity of the cloths inside a discharging shell along with tri-ethyl aluminum.

As shown in the parent applications, the carbon cloth is made easier to ignite as by etching its surface and/or coating the surface with lead or copper acetate deposited from aqueous solution. However, it can be ignited even when not pre-treated.

The carbon cloths can be folded in the manner described above for the metal foil to increase the dwell of their heat output. To retain the folds in the carbon cloth, the cloth can be impregnated with a stiffening resin, like polyethylene terephthalate or polyvinylacetate or polymethylmethacrylate. Alternatively, the carbon fiber can be woven with stiff metal wires or can be woven through a stiff metal screen.

The increased radiation effectiveness described above, is also obtained by adherently coating the radiating surfaces with a layer about 20 to about 500 microns thick of finely divided alumina, silica or zirconia, or mixtures of any two or all three in any proportions. Thus, a 0.4 millimeter-thick web of woven carbon fiber cloth pre-treated with 0.2 molar lead acetate and impregnated with 1% to 10% activated iron powder, is immersed into a 2.5% by weight solution of poly (ethyl acrylate) resin in methylethylketone, then the impregnated cloth is withdrawn from the resin solution, dried for a few seconds and dropped into a container having a quantity of 325-mesh zirconia. The container is shaken in order to get the zirconia particles spread over the cloth, after which the coated cloth is removed and dried. When the dried product is exposed to air, the particles of activated iron ignite and ignite the carbon which then burns and the incandescence thus produced has a high concentration of radiation in the 8-to-14-micron wave length of the spectrum. A somewhat better concentration is obtained when half the zirconia is replaced by alumina.

Silica and/or silicon carbide particles can be used in place of or in mixtures with the zirconia and/or alumina.

The particles can be applied to the carbon cloth web by spraying on it a slurry of the particles in the resin solution. It is preferred that the slurry contain a high concentration of the particles, about 10 to 50 times the weight of the resin.

A preferred technique is to take a flat carbon fiber cloth about 0.5 millimeter thick and pre-dipped as noted above in aqueous lead acetate and then dried, coat one of its faces with a spray of 90 parts by weight of a 1:1 mixture of 325-mesh $ZrO_2$ and $Al_2O_3$ slurried in 100 parts by weight of a 2 weight percent solution of poly (methylmethacrylate) in acetone. The coating is built up to a thickness of about ¼ millimeter, and then permitted to dry. On the opposite face of the cloth there is sprayed on, in an argon atmosphere, about a 70 micron-thick slurry of activated iron powder particles about 10 microns in size, in twice its weight of a 3 weight percent solution of poly (ethyl acrylate) in acetone. This coating can be as much as 300 microns in thickness. For such top coatings the volume of inorganic solids should be at least 80% of the total volume of the dried coating.

The second coating is dried in the argon atmosphere and still in that atmosphere is given a top coating of the $ZrO_2$-$Al_2O_3$-binder slurry, about ⅓ the thickness of the original $ZrO_2$-$Al_2O_3$-binder coating, and again the coated cloth is dried in the argon atmosphere. One or more of such coated cloths can be sealed in a plastic bag or decoy shell and will keep until needed for decoy use. At that time, the cloths are exposed to air and will spontaneously ignite. They show a very good thermal radiation in the 8-to-14 micron band. The face carrying the thicker $ZrO_2Al_2O_3$-binder coat shows stronger radiation in that band than the face carrying the thinner such coat.

Even better frequency distribution of the pyrophoric radiation is obtained when the pyrophoric surface coating is borosilicate or borochromate particles in which the boron oxide content is from about 5% to about 80%, preferably at least 25%, and most preferably at least about 50%.

Simple mixtures of $B_2O_3$ and $SiO_2$ tend to be hygroscopic when their $B_2O_3$ content is over about 50%, and should be appropriately handled until they are sintered or fused. A fused mixture of 65% $B_2O_3$ and 35% $SiO_2$ is very effective for radiation adjustment.

Solutions of other tacky resins such as other acrylic resins, polyvinylacetate, polyurethanes, silicones and pressure-sensitive resin formulations can be used in place of the noted poly acrylates. Suspensions of resins in liquids in which they do not dissolve are not particularly effective. However the top coatings can be suspended in an excess of colloidal silica or colloidal alumina dispersions, and applied in this form with or without organic binder.

Where an aluminum alkyl is used for ignition in place of the activated iron, the adhesive resin should not be one in which the alkyl dissolves.

Activated iron or nickel particles, when used, can be applied to the carbon cloth by the techniques described for the zirconia, or the resin-to-activated-powder ratio can be dimished and even reduced to zero. Thus, a resin-free slurry of very finely divided activated powder in water can be sprayed onto one or both faces of the carbon cloth to deposit about 1/50 to about 1/10 gram of the activated powder per square centimeter of cloth surface. After a little drying in argon, there is then sprayed over both faces of the particle-carrying cloth, a slurry of zirconia powder. The binder in the zirconia slurry then holds the activated powder particles in place, and such a coating not over about 100 microns thick does not prevent their pyrophoric reaction when the coated cloth is exposed to air.

The activated iron or nickel particles can alternatively be formed into foils with the help of a binder such as a resin like an acrylate or a polyester. Thus a quantity of pyrophorically activated iron powder in which the particles range in size from about 100 to about 250 microns is stirred into a 10% solution of polyethyl acrylate binder in methyl chloroform, in a proportion of about 4 to 5 parts of the powder to each part by weight of the solid binder. The resulting suspension is stirred and sprayed onto a flat surface of polished aluminum or polyethylene to build up a generally uniform layer about ½ millimeter thick. That layer is then permitted to dry in an argon atmosphere to yield a solid, self-supporting film about 250 microns thick that is readily pulled away from the aluminum or polyethylene surface against which it was cast. That film can then be cut into strips 3 to 10 millimeters wide which when exposed to air generate heat and act as decoys. The strips are also of relatively low density so that after being discharged into the air with or without other decoy strips and chaff, they flutter down.

Thinner strips, such as those that are about 100 microns thick, are somewhat more effective decoys. However the strips can be as thick as ¾ millimeters, and the pyrophoric particles similarly thick.

More effective are strip cut from film that is porous. To prepare such a porous product, the cast suspension has its solvent volatilized away under conditions that cause the solvent to boil. Thus the cast suspension can be inserted into a container which is evacuated to about 1/100 to 3/100 bar to cause bubble formation as the solvent is withdrawn from the layer. Alternatively any of the usual resin-blowing agents used to convert resins to foams can be mixed with the suspensions so that on drying, particularly at elevated temperatures, the suspension layer dries to a porous film.

A more preferred alternative is to roll or press the pyrophoric particles into a film of binder that is soft enough to permit the particles to at least partially penetrate, and adherent enough to hold onto the particles that so penetrate. Low density polyethylene heated to about 50° C. is suitable, as is open-celled or closed-celled microcellular foams of polyethylene or polypropylene or polystyrene or polyvinyl chloride. Such films and foams are available in thicknesses of about ¾ millimeter or less, and can be warmed and/or plasticized to make them softer and more adherent. Temperatures over 50° C. and high pressures are to be avoided inasmuch as they can cause pyrophoric particles to explode even in the absence of oxygen.

A ¾ millimeter thick ribbon of open-celled microcellular polyvinyl chloride foam can thus be coated with a ¼ millimeter high layer of pyrophoric iron particles about 200 to about 800 microns in size, and the unheated coated foam passed in an argon atmosphere through the bight of a pair of steel rollers each five centimeters in diameter spring-urged together by a force of about 10 kilograms. Most of the particles become locked in place in the foam to yield a product having good decoy characteristics. Most of the locked-in particles have at least some of their surfaces exposed so that they pyrophorically react more vigorously than when cast in suspension in a binder solution.

The thermal radiation produced by the foregoing films is of relatively long wave length, and that radiation spectrum can be adjusted for better decoy use by top coating the films with the very finely divided borosilicate and other adjusting materials described hereinabove. These very finely divided particles can be sprinkled onto a sticky film surface, such as that of a heated or incompletely dried film, so that they adhere to the final surface. The thickness of the layer of spectrum adjusting powder should be less than about 10 microns to keep from materially blocking access to the air.

It should be noted that the pyrophoric particles can be prepared by leaching aluminum from iron or nickel aluminides such as the commercially available ground Raney alloys, or by diffusion aluminizing iron or nickel powder, or by sintering such powder with aluminum, as in Example VIII.

The pyrophoric metal foils of the present invention can be prepared in large quantities by the use of the open-coil activating technique described in U.S. Pat. No. 4,443,557. A number of individual activating retorts can thus be loaded with an open coil of iron foil, and with the mixture of 20% powdered aluminum and 80% powdered alumina, along with about ½% to about 1% of AlCl$_3$ or CrCl$_3$ activator. The individual retorts so loaded are moved through a furnace as described in connection with FIG. 4 of U.S. Pat. No. 3,903,338, so the contents of each retort reach about 1200° F. for about ½ to about 1 hour. Better results are obtained at lower temperatures and longer times, as for example, 900° F. for 16 hours.

After cooling, the aluminized foil is reacted with aqueous caustic containing dissolved tin as described in the parent applications to leach out some of the aluminum which had diffused into the foil.

Alternatively, the foil can be activated by continuous reeling of a long length through a retort as shown in U.S. Pat. No. 4,435,481. As there described, the activation can be effected on one or both faces of the foil. The mixture of powdered aluminum and powdered alumina should have at least 40% alumina by weight, inasmuch as smaller proportions of alumina will permit some of the powdered aluminum, which melts during the treatment, to wet the foil. This is undesirable inasmuch as it blocks the activated diffusion of the aluminum into the iron. Such activated diffusion brings much more desirable results than diffusion from a melt coating.

As noted, the Raney-activated iron and nickel or alloys of these two as well as of cobalt can have their heat generation and high-temperature dwell increased by subjecting them to a very short treatment in dilute acid. An aqueous or non-aqueous solution of inorganic or organic acid having a pH of about 1 to about 4, preferably about 1.5 to 3.5 is effective, and stronger acidities are not as effective. The dip need only be about ½ minute long after gasing starts, but longer dips do not significantly detract from the effects unless the acid used is a strong mineral acid.

A 5-minute dip in 1% to 10% citric acid in water of freshly activated 4-mil thick iron foil, the leaching of which was effected in the presence of tin, increases its maximum pyrophoric temperature by about 90° F., and increases the dwell at or above 1200° F. from about 1.5 seconds to about four seconds. The dwell at or about 1150° F. is increased from about 2 seconds to about 4.8 seconds, and the dwell at or about 1100° F. from about 2.6 seconds to about 5 seconds.

A corresponding dip in 1% to 10% aqueous succinic acid produces about the same results, and similar acetic acid treatment effects only slightly smaller increases. Hydrochloric acid at 7% concentration in water is not quite as effective as 10% aqueous acetic acid. Other acids that can be used are chloracetic acid, formic acid, lactic acid, maleic acid, malonic acid, p-nitro benzoic acid, phosphoric acid, picric acid, salicylic acid, sulfuric acid and tartaric acid. Any acid capable of supplying a pH of between 1.5 and 4 is appropriate. However, acids like nitric acid attack the substrate very rapidly and contact with such acids should be held down to about $\frac{1}{4}$ minute.

The acids can be dissolved in lower monohydric alcohols such as methanol, ethanol or isopropanol or in mixtures of such an alcohol with water, and still provide the increase in maximum pyrophoric temperature and high temperature dwell. Organic acids are preferred, particularly the polycarboxylic acids.

The dips can be effected at any temperature from about 20° F. to about 210° F., but ordinary room temperatures of about 60° F. to 90° F. are easiest to use. Pyrophorically activated iron screens also show corresponding improvements in maximum pyrophoric temperature and high-temperature dwell. Such improvements of activated iron is obtained whether or not tin is used during its leaching.

Combining the acid dip with the folding described supra provides greater increases in dwell at the higher temperature.

Such increases are particularly desirable in the use of the activated materials as decoys for heat-seeking missiles. For such use, the Raney-activated and acid-treated metal is preferably a foil between about 2 and about 6 mils thick. As noted, the folding increases the foregoing high-temperature dwells at least an additional 60%.

The activated metal foils can also be coated with a binder-containing slurry of particles, such as those described above, that shift the pyrophoric radiation toward the 8-to-14 micron range, or away from the 2.6 micron band. Borosilicate particles desirably reduce the radiation in the lower than 3-micron band as compared to that in the higher than 3-micron band. The slurry should contain solid particles in an amount from about 10 to about 50 times the weight of the binder, and the coating should not be over about 100 microns thick on at least one face of the foil.

For activating a long length of iron or nickel foil, its surface can be aluminized by first depositing powdered aluminum on it as the foil is reeled past a depositing station, and then subjecting the thus coated foil to diffusion conditions to diffuse the aluminum into that surface. The particles of powdered aluminum, less than 250 mesh in size, can be poured onto the surface being coated, or they can be electrophoretically deposited from a suspension in benzene or a 2:1 by weight mixture of isopropanol and nitromethane, or the like. Electrophoretic potentials of about 50 to 200 volts are adequate with suspensions containing about 2 to about 10% aluminum and at temperatures of up to about 80° C. Suspending agents like zein or other proteins, in a concentration of 0.1 to about 0.3 percent by weight can also be included in the suspension.

A little $Al_2O_3$ or other inert powder may be mixed with the aluminum powder to improve the diffusion when the coated foil is subjected to diffusion conditions, particularly at temperatures that cause the aluminum particles to melt. As much as 40% inert material can thus be present, although such material can be completely omitted.

$AlCl_3$ or water-insoluble $CrCl_3$ make very effective activators when diffusion is effected below about 1100° F. At higher temperatures $NH_4Cl$ is preferred. These activators can in powdered form be mixed with the aluminum to the extent of about $\frac{1}{2}$ to about 1% by weight.

Long lengths of activated foil are conveniently cut into the desired pieces or chaff, by doing the cutting while the foil is covered by water or other protective liquid that prevents pyrophoric action. A body of the liquid can first be degased to remove dissolved oxygen, and the leached foil, with or without prior rinsing, introduced along with a rotary chopper, punch, or other cutting tool. The cut pieces or chaff are accumulated in the body of liquid. The cutting tool may have to be operated at a speed substantially less than that used when the tool is not submerged in a liquid.

The rotary chopper cuts transversely across the introduced foil to produce transverse strips having lengths equal to the width of the introduced foil, and having widths that are controlled by the speed with which the foil advances to the chopper and can be as little as one millimeter or as large as about one centimeter. If desired the foil can first be fed through a slitter, also submerged, that cuts longitudinally through the foil to sever it into narrower lengths.

A punch can provide punched-out pieces of almost any shape.

The above-mentioned aluminizing can be effected in very short times by heating a workpiece embedded in an activated powder pack, with a thermal input that brings it to diffusion coating temperature and completes the diffusion coating all in about 50 minutes or less. During this short interval the activator present in the pack begins to be volatilized at a relatively rapid rate that persists about 45 minutes, even if only present in the pack at a concentration of 0.5% by weight, and the formation of the diffusion coating case is extremely rapid. Thus, a $\frac{1}{2}$-mil aluminized case is produced only about 30 minutes after starting to heat a workpiece to 1800° F. in a pack of:

10 parts by weight: Aluminum powder about 100 microns in size
90 parts by weight: $Al_2O_3$ about 100 microns in size
with 0.5% powdered $NH_4Cl$ mixed in based on the weight of the pack, if the workpiece reaches 1800° F. in 15 minutes.

The foregoing very rapid diffusion coating technique is particularly suited for preparing pyrophoric articles such as cut foils. A mass of such articles can be mixed up with the diffusion coating powder and very quickly aluminized as a batch. The aluminized articles can then be sifted away from the powder and leached to remove enough aluminum to make them pyrophoric.

On the other hand a long length of 2-mil thick AISI 1010 steel or Armco iron foil can be unwound from a supply reel, subjected to the activation, and then wound up on a take-up reel with the entire activation sequence taking less than thirty minutes. Steel foils containing a carbon stabilizer such as titanium, columbium or vanadium in an amount about 6 times that of the carbon, are particularly desirable.

The first step in the activation sequence is preferably a surface cleaning as by blasting with glass beads or fine sand or solvent, and/or electrolytic or non-electrolytic alkaline cleaning. Heating of the foil can be initiated as it is unreeled and before, during or immediately after the cleaning step. The heating is then continued as the moving foil goes through a diffusion aluminizing by spray coating with molten aluminum as it heats up to 1450° F., and is then held at that temperature for about ten to forty minutes. Doing the diffusion at 1450° F. takes at least about twenty minutes to develop an effective diffusion case. A plasma spray can also be used to apply the aluminum.

After the diffusion has proceeded to the desired extent, the foil can go directly through a cool-down and then through a leaching solution. A very desirable leaching for 1010 steel is with a 10% aqueous solution of NaOH or KOH held at 170° F. to 212° F. Only about three minutes are generally needed. Keeping the leaching solution below 140° F. may call for the leaching to take as long as thirty minutes or a little longer. Leaching solutions having 15 or more percent caustic act more rapidly. About 1 to 2 grams of tin as sodium stannite is preferably present per liter of leaching solution, and somewhat less when the leaching is at the higher temperatures.

The leached foil is now in activated condition and can be wound onto the take-up reel with or without a rinsing off of any of the leaching solution dragged out by the moving foil. Rinsing is preferred, particularly where the leached foil is to be stored for more than a few hours. Prolonged contact with residual leaching solution diminishes the activity of the leached product and also tends to decrease the adhesion of the activated surface to the core of that product. The activity of the activated surface is preferably preserved by confining the leached product in an inert atmosphere such as nitrogen or argon, or by covering it with a protective liquid like glycerine. Volatile liquids like acetone and nonane will also protect the activity, but need to be in closed containers to prevent their escape.

All of the foregoing manufacturing steps can be conducted in an enclosed, generally gas-tight chamber as described and illustrated in Ser. No. 281,405, and as there shown the preliminary cleaning step and the leaching and take-up reeling can, if desired, be outside the chamber.

The leaching generates substantial quantities of hydrogen that can be used to flush out the atmosphere in the chamber and thus help protect the heated foil from attack by water vapor or steam generated from the leaching solution and from an electrolytic or non-electrolytic cleaner. A complete coating of liquid aluminum also protects the incoming steel and iron foils even at 1650° F. However, a hydrogen-rich atmosphere presents the danger of explosion, and it is accordingly desirable to inject into the treatment chamber a stream of inert gas such as argon or nitrogen at a rate that keeps the chamber atmosphere below its explosive limit.

The diffusion coating step is not as rapid as the other steps in the activating sequence, and so is the primary timing factor in that sequence.

By way of example, a one-meter-long induction coil furnace can be provided for coated foil to move through at the rate of two meters per hour, followed by a five-centimeter gap through which the foil cools by radiating its heat to the surroundings, and then a ten-centimeter travel through a leaching bath held at 190° F. Following that bath the foil moves through a falling stream of rinse water that terminates the leaching, rinses off the leachant, and cools the foil to about room temperature. The water-wet foil can then be dried under argon and spooled.

There is generally no need to use a diffusion coating energizer such as ammonium chloride in the atmosphere adjacent the surface being diffusion coated by the foregoing technique, but it can be used and will then help if the incoming coil has not been completely cleaned. Blasting with a stream of blasting grit generally does an adequate cleaning. With or without an energizer in an inert or reducing diffusion atmosphere, a continuous spray of aluminum on a continuously fed foil, or a continuous passage of such a foil through or on a body of molten aluminum, does not objectionably roughen it.

However, the smoothness of the sprayed-on aluminum layer does not assure suitable diffusion aluminizing when the diffusion step is conducted at elevated temperatures, i.e., above 1300° F. Thus, a two-mil thick 1010 type steel when sprayed with molten aluminum and rapidly heated to 1450° F. where it is kept for 30 minutes and then cooled, becomes wrinkled and distorted. A similar distortion problem is experienced by a 10-minute diffusion heat at 1600° F. Such wrinkling and/or distortion makes it awkward to manipulate the foils, but essentially entirely disappears during the leaching, and so does not significantly prevent the tight packing of such activated foils in containers for use as thermal decoys as described, for example, in Ser. No. 281,405. Sprayed-on aluminum coatings weighing from about 5 to about 30 milligrams per square centimeter, whether sprayed on as molten aluminum or as a slurry of aluminum particles, lead to the wrinkling and distortion.

For activating only one face of the foil, the other face can be protected or masked against diffusion, or the aluminum spray coating can be confined to the one face to be diffusion coated. This also leads to distortion and wrinkling.

Pre-alloying the aluminum with 5% to 15% silicon by weight reduces the wrinkling and distortion, but does not eliminate them completely. However, the diffusing in of a pre-coated foil yields after leaching an activated product having a thermal output when exposed to air, somewhat less than that of foils prepared by pack diffusion. Alloying with other materials such as zinc, calcium, germanium, magnesium, nickel and boron, also reduces the wrinkling and distortion but has less of an adverse effect on the thermal output. Conducting the leaching at elevated temperatures such as over 220° F., and particularly with aqueous solutions of at least 20% caustic soda or potash by weight also helps.

Wrinkling and distortion can also be reduced by conducting the diffusion at lower temperatures. Below about 1000° F., the wrinkling and distortion is completely prevented, but the diffusion time is increased to as much as four hours or more. At these low temperatures pack diffusion with anhydrous water-insoluble $CrCl_3$ as energizer, is preferred.

By activating only one face of a foil, the activation can be made to penetrate most of the way through the foil thickness, leaving only about 20% of that thickness as a structural backbone. The unactivated face of a stainless steel or plain iron foil can be plated with aluminum to improve its radar reflection characteristics. The so-called Schoop aluminizing with a spray of molten aluminum is effective to deposit an aluminum film only about 0.1 to 0.3 mils thick on the back of a roll of activated foil as it is unspooled and then respooled in an Argon box. A layer of copper or even silver can be similarly deposited in place of the layer of aluminum. Copper and silver are not attacked by leaching baths, so that they can be deposited before or after the leaching.

The radar reflectivity associated with pyrophoric foils is also increased by mixing them with standard aluminum radar chaff or foils. Such aluminum foils or chaff only about ½ mil thick or thinner, mixed with two to five times as many pyrophoric one-inch discs of iron foil, make an effective heat and radar decoy when ejected as a mass from an exploding cartridge. The aluminum foil can be thread-like slivers only about 1 millimeter wide or less, to further improve the decoy action. Chaff made by chopping up aluminum-coated plastic or glass fiber, foil or thread is particularly helpful.

Decoy action can also be improved by discharging mixtures of pyrophoric materials in which some of the materials ignite very promptly, and some take a little longer. Thus powdered activated iron or nickel reach radiation temperature in less than a second, whereas foils and binder-containing materials take more than a second. Alternatively the materials can be discharged in successive bursts of smaller quantities to thus prolong the effective radiation.

An alternative technique for preparing activated foil is to apply a Raney type layer to one or both faces of a foil substrate, using a sintering technique. Thus a mixture of nickel and aluminum powders the particles of which are from about 1 to about 12 microns in size, are in a proportion of 3 atoms aluminum to 1 atom nickel slurried in a 2% solution of polyethylacrylate in methyl chloroform, and the resulting slurry sprayed onto a 50 micron thick steel foil to build up a coating particle thickness of about 25 to about 50 microns on each face. The thus-coated foil is then dried to volatilize off its solvent content, and then embedded in a pack of chromium granules held in a metal retort. A stream of argon is flushed through the retort and then replaced with a stream of hydrogen, while the retort is heated to about 815° C. for about 90 minutes. The retort is then cooled and the coated foils removed. They now show rough sintered-on metal faces which when leached as described above show excellent pyrophoric action.

The nickel and aluminum particles are known to inter-react very aggressively, and the retort heating time can be reduced to as little as 5 minutes or even less. It takes a very few minutes for the powders to reach their inter-reacting temperature of about 300 degrees Centigrade, and once they start to inter-react they generate sufficient heat to take the coatings to above 750° C. to thus complete the sintering to the substrate foil. That substrate can be as thin as 10 microns to further increase the final pyrophoric heat output.

It is not necessary to use a retort. A preheated tube through which argon or hydrogen flows can have passed through it a foil carrying on one face the foregoing coating. In only about one minute the nickel-aluminum reaction takes place to leave a sintered-on product that after leaching shows excellent pyrophoric action.

Steel foil is a very inexpensive substrate, but other metal substrates such as nickel or copper foils can be used.

Iron powder can be substituted for the nickel powder, preferably with the iron-aluminum atom ratio of 1:2, and similar results are obtained. However the reaction between iron powder and aluminum powder is not as aggressive and requires a somewhat higher heat-up temperature.

Cobalt can also be substituted for the nickel, without changing its proportion to aluminum.

The chromium granule bed can be replaced by a bed of powdered alumina, and the hydrogen flush by a helium or argon flush, without significantly altering the results. The retort atmosphere need not contain any diffusion activator to improve the sintering action.

The powder-carrying foil can be heated to reaction temperature without embedding it in a pack. The retorting time for such a treatment is reduced to less than 15 minutes, inasmuch as there is no pack to heat up.

The foregoing powder-sintering techniques are particularly suited for preparing pyrophoric foil on a continuous basis. Thus a ½, 1 or 2-mil thick substrate foil can be unspooled and passed through gas seals into and out of a heated hydrogen-filled retort in a relatively cool portion of which the inter-reacting powders are poured onto the foil. After the desired dwell in the hot part of the retort the powder-carrying foil is pulled out and then through a leach bath where the leaching is completed in about the same length of time as the sintering so that the sequence can be realistically conducted using a retort path as short as ½ to 1 meter to achieve a high output rate.

Where the final foil is desired to have both surfaces pyrophoric, the sintering step can be repeated with the substrate foil held upside down and a fresh sintering mixture applied to the surface that now faces upwardly.

The proportions of aluminum to nickel or iron can be varied about plus or minus 20% with little loss of effectiveness. Moreover the sintering powder can have its nickel and iron mixed together in any proportion to vary the pyrophoric action. Also the final foil can be made with activated iron on one face and activated nickel on its other face. The activated nickel pyrophorically reacts more sharply but that reaction is completed in substantially less time, so that the dual coatings work a balancing of the reactions on their separate faces.

The foregoing sintering is preferably conducted with reacting particles no larger than about 50 microns. The smaller the particles the more rapid and effective is the sintering, and the use of high heating temperatures such as 1000° C. also helps.

The sintering technique is also suitable for applying protective coatings. Thus a B-1900 superalloy jet engine blade can have its airfoil portion given a protective nickel aluminide coating by sintering to that portion a mixture of the foregoing finely divided nickel and aluminum powders in 1:1 atomic proportion. In such proportion the powders are even more vigorously inter-reactive so that heating times can be as indicated above. However for very smooth and adherent protective coatings 20 to 60 microns thick, sintering heat is preferably maintained for at least about 15 to 30 minutes.

Such protective coatings are not significantly attacked by caustic leaches, and they can be modified to increase their protective effects. Thus by also adding chromium powder in an amount about 20% of the total powder, a more protective chromium-containing coating is formed.

The pyrophoric output of activated iron foils or powder is increased when the leaching step is conducted with a little hydrogen peroxide in the leaching liquid. As little as 0.1% $H_2O_2$ by weight of the leachant is enough to show such results, and from about 0.2% to about 0.5% is preferred. Concentrations of 3% or higher tend to darken and diminish the pyrophoric activity.

By way of example, to a 20 weight percent solution of NaOH in water there is added 0.2 weight percent $H_2O_2$, and the resulting mixture at room temperature is used to leach 2 mil thick iron foil that has been aluminized to a depth of ½ mil on both its faces. The leaching generates a very small amount of gas as compared to corresponding leaching without the $H_2O_2$, and is completed in about 30 minutes even if the leach solution warms up to about 50° C. during the leaching.

About the same leach time as in the above illustration is required when the leachant is KOH and starting leach solution is at any temperature from about zero to about 50° C., although leachant that starts at 50° C. can heat up to about 60° C. The foregoing leachings are conducted with about one hundred times as much leach solution as substrate being leached, by weight. Preferred caustic concentrations are from about 8% to about 20% NaOH or KOH in water, by weight.

Instead of pouring $H_2O_2$ into a leach solution, peroxides such as sodium peroxide, potassium peroxide and calcium peroxide can be added to the leach solution to form $H_2O_2$ in situ.

The foil activated in accordance with the foregoing example also shows about 15% more heat output and about 50° F. higher maximum temperature rise than the corresponding foil activated without the help of the $H_2O_2$. Iron powders also show about the same improvements as the foils do.

Leaching of aluminized iron, either foil or powder, is best conducted with some tin or stannite ion dissolved in the leachant, but the concentration of the tin can be reduced to as little as about ½ gram dissolved tin per liter of leachant when the $H_2O_2$ of the present invention is present in the leachant. Preferably the dissolved tin content is as high as 1 gram per liter. Such tin reduction is also noted in the rapid high-temperature leaching of parent Ser. No. 707,656.

Not only is less tin needed in the leachant, but the iron activated with the $H_2O_2$ in the leachant contains less tin than is contained in iron activated pursuant to the prior art. Such tin is introduced as metal into the pores of the activated iron and even in very small amounts helps preserve the activation.

It is noted that the presence of the $H_2O_2$ in the leachant according to the present invention, has an effect opposite to that of the $H_2O_2$ when it is applied to the activated metal after the leaching is completed. Such later application causes the activated metal to lose some or all of its pyrophoricity, and to turn black.

The increase in heat output caused by the presence of the $H_2O_2$ in the leachant, can be heightened by subsequently subjecting the activated metal to the short treatment with dilute acid, with or without the folding, as described above.

Pyrophorically activated nickel, particularly in the form of foil, tends to become passivated in an unpredictable manner. When this happens the material remains activated but will not react with the air unless it is heated to about 50° C. or higher.

It has now been discovered that this passivation tendency can be reduced or completely avoided if the leaching step in the activation is conducted at temperatures at least as high as 90° C., and the higher the better. The concentration of caustic in such leaching bath can be as low as 5% by weight, and the time at such elevated temperatures should be at least about 15 minutes. Thus a boiling solution of 10% NaOH in water will leach most activated nickel foils in about 30 minutes to yield a very active product showing no tendency to passivate. Shorter leaching times give a somewhat less active product that still does not passivate unless the leaching time is less than 15 minutes.

Aluminizing can be used to prepare aluminized steel, iron, nickel, stainless steel or other substrates for conversion to Raney-type activated metals, as described in U.S. Pat. No. 4,154,705. Both self-supporting substrates and powdered substrates can be so activated and such activation of powders is described in parent application Ser. No. 507,174. This type of treatment provides the greatest degree of activation for foils or other self-supporting substrates when the aluminizing is effected at the lowest temperatures—below 1000° F.— and at such low temperatures energizers such as inexpensive ammonium halides give undesirable diffusion cases.

According to the present invention, there are provided pyrotechnic compositions which ignite at temperatures above 100° C., e.g., at about 300° C., and have a substantial aluminum content as well as a high thermal output. These compositions are activated aluminides of metals like molybdenum, zirconium and columbium that when not combined with aluminum ignite in air at about 500° C. to 700° C. at atmospheric pressure. These metals are easily combined with aluminum to form alloys or aluminides having two or more atoms of aluminum for each atom of ignitible metal, and when so combined generally have ignition temperatures not much different from that of the pure ignitible metal as noted above. Incorporating about 2% to about 10% boron in such alloy, based on the weight of the ignitible metal, generally lowers the ignition temperature by about 20° C. However, the ignition temperature of the aluminide with or without the boron, is lowered about 100° C. to about 150° C. by activating the aluminide.

The activation of the present invention is the leaching out of some of the aluminum, as with aqueous caustic soda or caustic potash. For this activation, the aluminum alloy preferably has between about 2.5 and 3.5 atoms of aluminum for every atom of alloyed ignitible metal, and the leaching preferably removes all the aluminum in excess of two atoms per atom of ignitible metal. This is illustrated by the following example:

EXAMPLE IX

One kilogram of aluminum covered by a cryolite flux is melted in a stainless steel retort under argon, and there is then stirred into the melt 600 grams of powdered molybdenum. The stirring is continued for about ½ hour while the contents of the retort are maintained at about 1200° C. to about 1400° C. to complete the alloying.

The melt is then permitted to cool and solidify, after which the metal layer is crushed into small pieces and the pieces ground to a maximum particle size of about 0.3 millimeter. The ground product is now poured into an excess of 25% NaOH solution in water. Bubbles are immediately evolved as the caustic attacks the alloy particles, and the evolution begins to noticeably slow down after several hours, reaching a very low level after about six hours. The caustic is then poured off, and the residual particles washed with water and dried.

Thus activated, the particles have a porous surface and are stable in air at temperatures as high as 300° C. However, when a mass of the particles is heated in air to above that temperature, the particles ignite and vigorously react with the air. The reaction is an oxidation and is completed on the smaller particles before it is completed on the larger particles of the ground mass, so that the pyrotechnic effect is more intense for about the first minute, and drops off somewhat for about another minute. On an asbestos pad the oxidizing particles become red hot and gradually crumble to a powder. Such pyrotechnics generate temperatures well over 1000° C., and can accordingly be used to supply heat for the bright annealing or other purposes.

Zirconium and columbium behave very similarly when treated as in the foregoing Example. After activation they ignite at about 350° C. in air at atmospheric pressure, and the ignition point of their aluminum alloy before activation is about 500° C., being not much different from the ignition point of the pure metals.

The activities of the activated alloys are lower when the leaching is terminated earlier, and are also lower when the alloys subjected to the activation have a less than 3:1 proportion of aluminum atoms to ignitible metal atoms. There are also some reactivity increases when the leaching is made more intense, as by starting with a hot or boiling caustic solution, and by increasing the caustic concentration to saturation. However, very good reactivity is obtained when the leaching is effected at 20° C., although the leaching is slower at that temperature. At boiling temperatures with saturated caustic, the leaching can be completed in less than two minutes.

It is not essential for the aluminides of the present invention to be prepared by melting. Thus, iron, zirconium, titanium, molybdenum and columbium can be effectively alloyed with aluminum by a thermal diffusion. Fine powders of the separate alloy ingredients can be uniformly mixed in a diffusion coating retort and heated to about 600° C. in an $AlCl_3$ atmosphere for only about six hours to produce usable alloy when the ignitible metal powder particles are no larger than about 10 microns. Larger particles take a little longer. Other halide atmospheres, such as of anhydrous $CrCl_3$, either in its water-soluble or water-insoluble form, or elemental chlorine, bromine or iodine, can be used in place of the $AlCl_3$ as the diffusion-energizing atmosphere. Only about ½% to about 1% of such energizer is mixed with the powders to be alloyed.

Tri-aluminides of some of the noted metals are also available as articles of commerce.

The leaching of the present invention can also be effected with inhibited hydrochloric acid such as that referred to supra, but the resulting activation is not as great as produced by caustic leaches, and is sometimes absent.

There can also be included in the foregoing alloys ingredients that improve the pyrotechnic behavior. Thus, about 2% to 20% of boron or magnesium or iron or mixtures of these, are helpful in this respect, and can be added to a melt or to a diffusion-alloying mixture. Also, these metals can be introduced by diffusion into a pre-formed aluminide or by diffusion with the aluminum. For example, 250 grams of powdered $ZrAl_4$ can be mixed with 10 grams of powdered boron and 5 grams of sodium fluoborate, and subjected to a diffusion heat as described in U.S. Pat. No. 3,801,357, but without using inert solid diluent, for three hours at 1800° F. in an argon-bathed atmosphere.

About 1% to about 10% of iron can be similarly introduced into the aluminide with or without the boron, to provide activatable alloys that after activation ignite at temperatures of about 300° C. or a little lower. Magnesium-aluminum alloys can also be activated by the foregoing techniques to provide activated material having ignition temperatures below 300° C. The magnesium-aluminum alloys preferably have, before activation, at least two atoms of aluminum for every atom of magnesium, but can be activated even when the aluminum-magnesium atom proportion is as low as 1½:1. The aluminum-to-zirconium atom ratio is preferably at least 4:1 but can be as low as 2:1.

Including 2% to 20% boron in the magnesium-aluminum or zirconium-aluminum alloys, based on the weight of the magnesium or zirconium, also increases their pyrotechnic output.

The foregoing pyrotechnic improvements are also obtained with alloys in the form of foils and sheets, as well as powders.

The boron additions of the present invention can also be effected by the procedures described in U.S. Pat. No. 4,536,215.

The foregoing low-ignition-point activated alloys are readily ignited with an ordinary household match.

Metals can be boronized instead of metallized, to increase their surface hardness as described for example in U.S. Pat. Nos. 3,673,005 and 3,935,034. No leaching is needed, and indeed the addition of activators is not necessary but is sometimes helpful. Boronizing of low carbon or medium carbon steels is particularly desirable because these steels are very inexpensive. Thus, the process of Example 5 in the '034 patent gives very good results when conducted in a hydrogen atmosphere on 1010 steel. Similarly low-chromium steel is given a particularly hard surface when packed with amorphous boron only and heated to 1700° F. for one hour under hydrogen.

Improved results are obtained when boronizing ferrous metals, by arranging for the boronized coating to have little or no FeB. An $Fe_2B$ coating appears to provide a very hard product that does not delaminate or crack.

To achieve the foregoing low-boron coatings, diffusion boronizing is carried out in a pack having powdered iron boride in a proportion that deposits little or no FeB. Thus a plain carbon steel workpiece can be packed in an iron boride having a 1:1 atomic mixture of iron and boron, and fired at 1600° F. for 3 hours under argon. A little floride activator like ½% $NH_4F$ helps provide a more uniformly coated product. Such an activator can be added as a bottom layer in the diffusion coating retort, and does not have to be uniformly mixed into the pack.

Iron-boron packs in which the iron content is at least about 20 atom percent and as high as about 65% are thus desirable, and firings can be at temperatures from about 1350° to about 2000° F. for 1 to 6 hours. Activators other than $NH_4F$ can be used.

Similar improvements are obtained with nickel, chromium, titanium, manganese, tantalum, molybdenum, vanadium, zirconium, hafnium and cobalt workpieces, by using corresponding metal borides in the diffusion coating packs.

Obviously many modifications and variations of the present invention are possible in light of the above teachings. It is, therefore to be understood that within the scope of the appended claims the invention may be practiced otherwise than as specified.

What is claimed is:

1. The process for production of nickel and iron aluminides which comprises pouring onto an iron foil a mixture of powdered aluminum and powdered nickel and/or iron, which mixture also contains about 1/30 to about ⅓ atom copper for every atom of nickel and iron, and in a suitable atmosphere heating the mixture to cause the powdered metals to interact.

2. The process of claim 1 in which the mixture also contains about 1 to about 4% by weight of powdered boron.

3. The process of preparing a pyrophorically modified foil, in which process a metal foil about 0.02 to about 0.05 millimeters thick has applied to its surface a layer of a mixture of powdered aluminum with iron, nickel or both iron and nickel which is then heated to cause the powders to inter-react without materially degrading the foil, to form aluminides of iron or nickel or iron-nickel having at least twice as many aluminum atoms as nickel and iron atoms, sintered to the foil, thereafter the resulting foil is leached to remove some of the aluminum from the aluminides and thus to develop pyrophoricity.

4. The process of claim 3 in which the powder mixture has not more than about 2.6 atoms of aluminum for each atom of iron and nickel.

5. The process of claim 3 in which the powder mixture also contains powdered boron in an amount about 1 to about 4% by weight.

6. The process of claim 3 in which the foil is an iron foil.

7. The process of claim 3 in which the powder mixture is applied in a layer that leaves the leached product about 0.3 to about 0.7 millimeters thick.

8. The process of claim 7 in which the product before leaching is rolled under pressure to reduce its thickness by about ¼ to about ½.

9. The process of claim 3 in which the aluminide surface of the leached product is porous and in the pores is introduced a finely divided material that does not block pyrophoric action and when said finely divided material is ignited by such action added heat is generated.

10. The process of claim 3 in which the leached product is subjected to a mild acid treatment to increase its pyrophoric heat output.

11. The process of claim 3 in which the leached product has an additional coating of a radiation-improving powder.

* * * * *